US012256595B2

(12) United States Patent
Magno et al.

(10) Patent No.: US 12,256,595 B2
(45) Date of Patent: Mar. 18, 2025

(54) BAND EDGE EMISSION ENHANCED ORGANIC LIGHT EMITTING DIODE-BASED DEVICES THAT EMIT MULTIPLE LIGHT WAVELENGTHS

(71) Applicant: RED BANK TECHNOLOGIES LLC, Red Bank, NJ (US)

(72) Inventors: John N. Magno, St. James, NY (US); Gene C. Koch, Albany, OR (US)

(73) Assignee: Red Bank Technologies LLC, Red Bank, NJ (US)

( * ) Notice: Subject to any disclaimer, the term of this patent is extended or adjusted under 35 U.S.C. 154(b) by 113 days.

(21) Appl. No.: 17/484,798

(22) Filed: Sep. 24, 2021

(65) Prior Publication Data
US 2022/0102685 A1    Mar. 31, 2022

Related U.S. Application Data

(60) Provisional application No. 63/083,450, filed on Sep. 25, 2020, provisional application No. 63/083,496, filed on Sep. 25, 2020.

(51) Int. Cl.
*H01L 29/08*    (2006.01)
*H10K 50/858*    (2023.01)

(52) U.S. Cl.
CPC ................. *H10K 50/858* (2023.02)

(58) Field of Classification Search
CPC .................................................. H10K 50/858
USPC ........................................................ 257/40
See application file for complete search history.

(56) References Cited

U.S. PATENT DOCUMENTS

| | | |
|---|---|---|
| 3,637,294 A | 1/1972 | Berthold, III |
| 6,587,620 B2 | 7/2003 | Koyama et al. |
| 7,158,695 B2 | 1/2007 | Sugitatsu et al. |
| 7,194,016 B2 | 3/2007 | Bullington et al. |
| 7,315,663 B2 | 1/2008 | Wu |
| 7,335,921 B2 | 2/2008 | Magn et al. |
| 7,639,362 B2 | 12/2009 | Ye et al. |
| 7,660,029 B2 | 2/2010 | Ashrit et al. |
| 8,155,163 B2 | 4/2012 | Saito et al. |
| 8,304,796 B2 | 11/2012 | Fukuda |
| 8,363,185 B2 | 1/2013 | Cho et al. |
| 8,610,103 B2 | 12/2013 | Menon et al. |

(Continued)

FOREIGN PATENT DOCUMENTS

| | | | |
|---|---|---|---|
| CN | 102077428 B | 1/2013 | |
| CN | 102856463 A * | 1/2013 | ............. G02B 5/285 |

(Continued)

OTHER PUBLICATIONS

PCT, Notification Concerning Transmittal of International Preliminary Report on Patentability for Application PCT/US2021/052013 dated Apr. 6, 2023.

(Continued)

*Primary Examiner* — Phuc T Dang
(74) *Attorney, Agent, or Firm* — Kolisch Hartwell, P.C.

(57) ABSTRACT

Light emitting photonic crystals that comprise organic light emitting diodes and that are capable of emitting multiple wavelengths of light simultaneously and methods for fabricating the same are disclosed. Disclosed light emitting photonic crystals emit light at wavelengths at the two edges of a stop-band. Methods for adjusting the width of stop-bands of disclosed devices are also disclosed.

11 Claims, 16 Drawing Sheets

(56) References Cited

U.S. PATENT DOCUMENTS

| | | | |
|---|---|---|---|
| 8,623,284 | B2 | 1/2014 | Chakravarty et al. |
| 8,693,823 | B2 | 4/2014 | Ouyang et al. |
| 8,699,835 | B2 | 4/2014 | Ouyang et al. |
| 8,860,005 | B1 | 10/2014 | Bedell et al. |
| 9,129,552 | B2 | 9/2015 | Magno et al. |
| 9,164,026 | B2 | 10/2015 | Chakravarty et al. |
| 10,036,905 | B2 | 7/2018 | Ouyang et al. |
| 10,600,358 | B2 | 3/2020 | Jeong et al. |
| 10,610,846 | B2 | 4/2020 | Chakravarty et al. |
| 10,680,185 | B2 * | 6/2020 | Magno ............... H10K 71/191 |
| 11,139,456 | B2 | 10/2021 | Magno et al. |
| 11,387,434 | B2 | 7/2022 | Magno et al. |
| 11,398,614 | B2 | 7/2022 | Koch et al. |
| 2001/0004188 | A1 | 6/2001 | Jacobsen et al. |
| 2002/0003827 | A1 | 1/2002 | Genack et al. |
| 2003/0214691 | A1 | 11/2003 | Magno et al. |
| 2004/0069995 | A1 | 4/2004 | Magno et al. |
| 2004/0206965 | A1 | 10/2004 | Evans |
| 2005/0127831 | A1 | 6/2005 | Takeuchi et al. |
| 2005/0225233 | A1 | 10/2005 | Boroson et al. |
| 2007/0159086 | A1 | 7/2007 | Yu et al. |
| 2007/0177388 | A1 | 8/2007 | Wang |
| 2008/0007168 | A1 | 1/2008 | Lee et al. |
| 2008/0284320 | A1 | 11/2008 | Karkkainen |
| 2010/0283068 | A1 | 11/2010 | Buckley et al. |
| 2013/0193416 | A1 | 8/2013 | Shin |
| 2014/0001450 | A1 | 1/2014 | Shinotsuka et al. |
| 2014/0077688 | A1 | 3/2014 | Weaver et al. |
| 2015/0008419 | A1 | 1/2015 | Li |
| 2015/0132876 | A1 | 5/2015 | Shin |
| 2015/0280170 | A1 | 10/2015 | Harikrishna Mohan et al. |
| 2015/0287957 | A1 | 10/2015 | Yoshida et al. |
| 2017/0346029 | A1 | 11/2017 | Kim et al. |
| 2018/0164502 | A1 | 6/2018 | Qin et al. |
| 2018/0183007 | A1 | 6/2018 | Magno et al. |
| 2018/0190929 | A1 | 7/2018 | Koch et al. |
| 2020/0295305 | A1 * | 9/2020 | Magno ................ H10K 50/82 |
| 2021/0234112 | A1 | 7/2021 | Seo et al. |

FOREIGN PATENT DOCUMENTS

| | | | | |
|---|---|---|---|---|
| EP | 1587186 | B1 | 7/2008 | |
| GB | 2356713 | A | 5/2001 | |
| JP | 09501004 | A | 1/1997 | |
| JP | 2002063990 | A | 2/2002 | |
| JP | 2003151761 | A | 5/2003 | |
| JP | 2003515769 | A | 5/2003 | |
| JP | 2005071919 | A | 3/2005 | |
| JP | 2005524958 | A | 8/2005 | |
| JP | 2005328040 | A | 11/2005 | |
| JP | 2006505092 | A | 2/2006 | |
| JP | 2007156441 | A * | 6/2007 | ........... G02B 5/1809 |
| JP | 2009514145 | A | 4/2009 | |
| JP | 2013543214 | A | 11/2013 | |
| KR | 20050027982 | A | 3/2005 | |
| KR | 20180003164 | A | 1/2018 | |
| KR | 20180021843 | A | 3/2018 | |
| WO | 2009107355 | A1 | 9/2009 | |
| WO | WO-2010146088 | A1 * | 12/2010 | ........... H01G 9/2031 |
| WO | 2012035083 | A1 | 3/2012 | |
| WO | WO-2016209797 | A1 * | 12/2016 | ............ C30B 23/00 |

OTHER PUBLICATIONS

International Search Report for corresponding application No. PCT/US2021/52013 dated Dec. 13, 2021.

Saxena, Kanchan et al., "A review on the light extraction techniques in organic electroluminescent devices", Optical Materials, vol. 32, Aug. 27, 2009, pp. 221-233.

Shin, Jae-Kyung, Examiner, Korean Patent Office, "Notice of Preliminary Rejection" in connection with related Korean Patent Application No. 10-2023-7013800, dated Jul. 1, 2024, 14 pages.

Welter, Steve, Examiner, European Patent Office, "Extended European Search Report" in connection with related European Patent Application No. 21873541.3, dated Jul. 24, 2024, 8 pages.

* cited by examiner

BAND EDGE EMISSION ENHANCED ORGANIC LIGHT EMITTING DIODE-BASED DEVICES THAT EMIT MULTIPLE LIGHT WAVELENGTHS

CROSS REFERENCE TO PRIORITY APPLICATION

This application claims the benefit under 35 U.S.C. § 119(e) of the earlier filing date of the U.S. Provisional Application No. 63/083,450, filed Sep. 25, 2020, the entirety of which is incorporated by reference herein, and of U.S. Provisional Application No. 63/083,496, filed Sep. 25, 2020, the entirety of which is incorporated by reference herein,

BACKGROUND

U.S. patent application Ser. No. 15/738,214, filed Dec. 20, 2017, which is scheduled to issue on Oct. 5, 2021 as U.S. Pat. No. 11,139,456 discloses light emitting photonic crystal devices (termed BE-OLEDs) in which an organic light emitting diode (OLED) is embedded as a single zone or layer of one-quarter wave optical thickness within a single one-dimensional photonic crystal. Usually, one of the low index zones of the alternating low refractive index zone/high refractive index zone structure of the photonic crystal comprises the OLED structure. The functioning of the BE-OLED devices relies on the formation of a "stop-band" (also sometimes referred to as the band gap) within the photonic crystal. The stop-band is a range of light wavelengths for which solutions of the wave equation for the propagation of light do not exist. That is to say, for these wavelengths a luminescent molecule embedded in the photonic crystal cannot emit light in the direction of the refractive index alternation within the photonic crystal structure. In photonic crystals the center wavelength of the stop-band has a value that is four times the optical thicknesses of each of the high refractive index and low refractive zones within the photonic crystal.

BRIEF DESCRIPTION OF THE DRAWINGS

The following detailed description references the following drawings.

DETAILED DESCRIPTION

Figure 1:
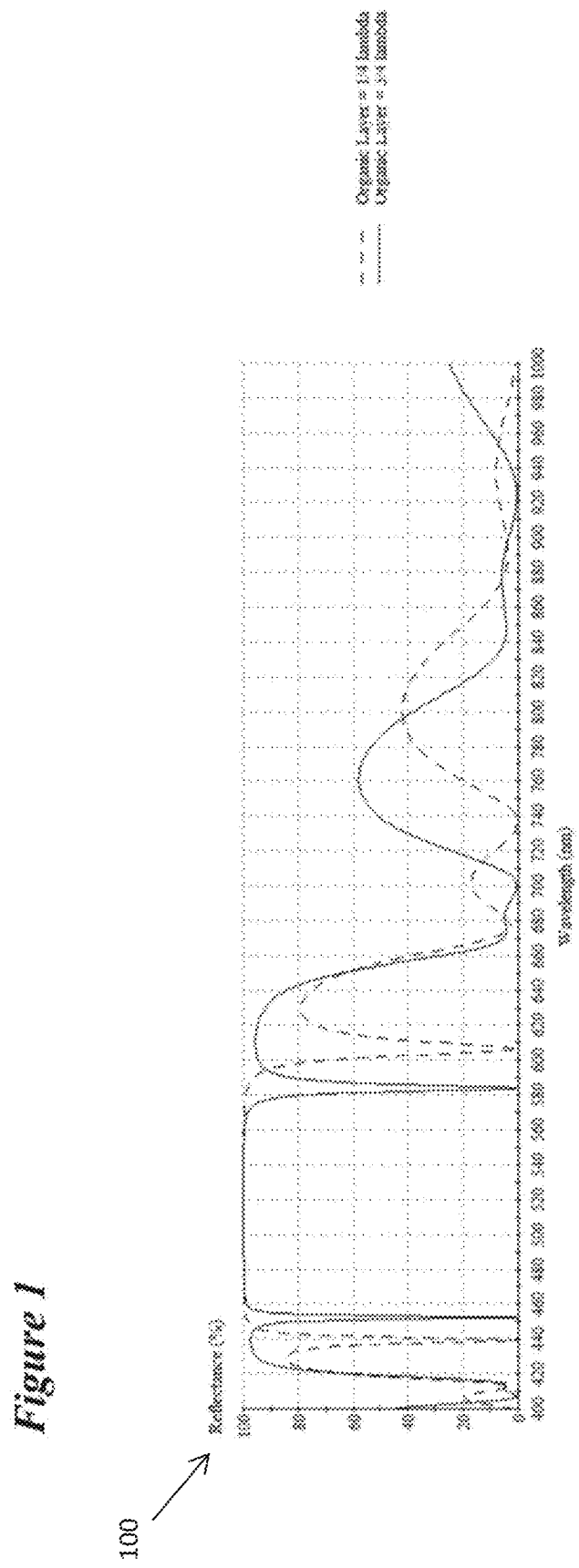
FIG. 1 illustrates the computer modeled reflectance spectra of a two photonic crystal structures as in FIG. 2.

A light emission function of BE-OLED devices depends upon the fact that within these devices an edge of the stop-band (generally the short wavelength edge) overlaps the emission spectral band of the electroluminescent material within the OLED structure. It is a property of photonic crystals that the density of states at the band edge wavelengths of the stop-band associated with the photonic crystal is considerably higher than for the same wavelength in air or vacuum. The result is that the light emission of the electroluminescent material is considerably enhanced over what it would be in other media. In addition, a considerable portion of light that is emitted in the band edge states or modes is retained within the photonic crystal structure bathing the photoluminescent molecules in a high luminous flux of light in the band edge wavelengths. This intense retained light stimulates additional light emission from other molecules of electroluminescent material that are in excited states due to electrical excitation. Since the light that is emitted into the band edge modes of propagation is constrained to emission in a narrow band of angles about the normal to the surface of the BE-OLED and since the stimulated emission replicates the propagation modes of the stimulating light radiation, the light is emitted by the BE-OLED in a narrow cone of angles. The emission of light in a narrow cone of angles about the normal to the BEOLED's surfaces results in almost complete outcoupling of light from the BE-OLEDs making them much more energy efficient than conventional OLEDs.

High energy efficiency and collimated light emission of BE-OLEDs are very desirable for many applications. In addition, the narrow spectral emission bands of these devices can also be highly desirable when highly saturated colors are required in light emission. However, the narrow spectral emission bands are an issue if the intent is to use BE-OLEDs in applications requiring white light. Some solutions to this problem have already been considered. The first is to situate multiple BE-OLEDs emitting different colors adjacent to each other on the same substrate. Issues with this approach are its manufacturing complexity and that it is quite difficult to produce lamp optics that will blend the colors together so as to produce uniform light chromaticity over the whole range of light emission angles. US Patent Application Publication 2018/0190929 describes BE-OLED-based devices in which luminescent materials are coated at an emissive surface of a BE-OLED that emits shorter wavelength light (e.g. blue or violet). The light from the BE-OLED is absorbed by the photoluminescent material producing photoluminescent emission from that material. The photoluminescent material used can emit white light. In this case the light emission is over a wide cone of angles and this can be undesirable in some applications. In addition, if some of the shorter wavelength light from the BE-OLED leaks through the white photoluminescent top layer, the uniformity of light emission versus emission angle can suffer. If a sufficient thickness of the white photoluminescent material is coated to eliminate leakage of the BE-OLED emitted light, the energy efficiency of the device can suffer due to light absorption in the photoluminescent material.

What is needed is a BE-OLED-based device that emits light in a narrow cone of angles at multiple wavelengths (e.g., white light) and has uniform chromaticity over the range of angles at which it emits.

Figure 2:
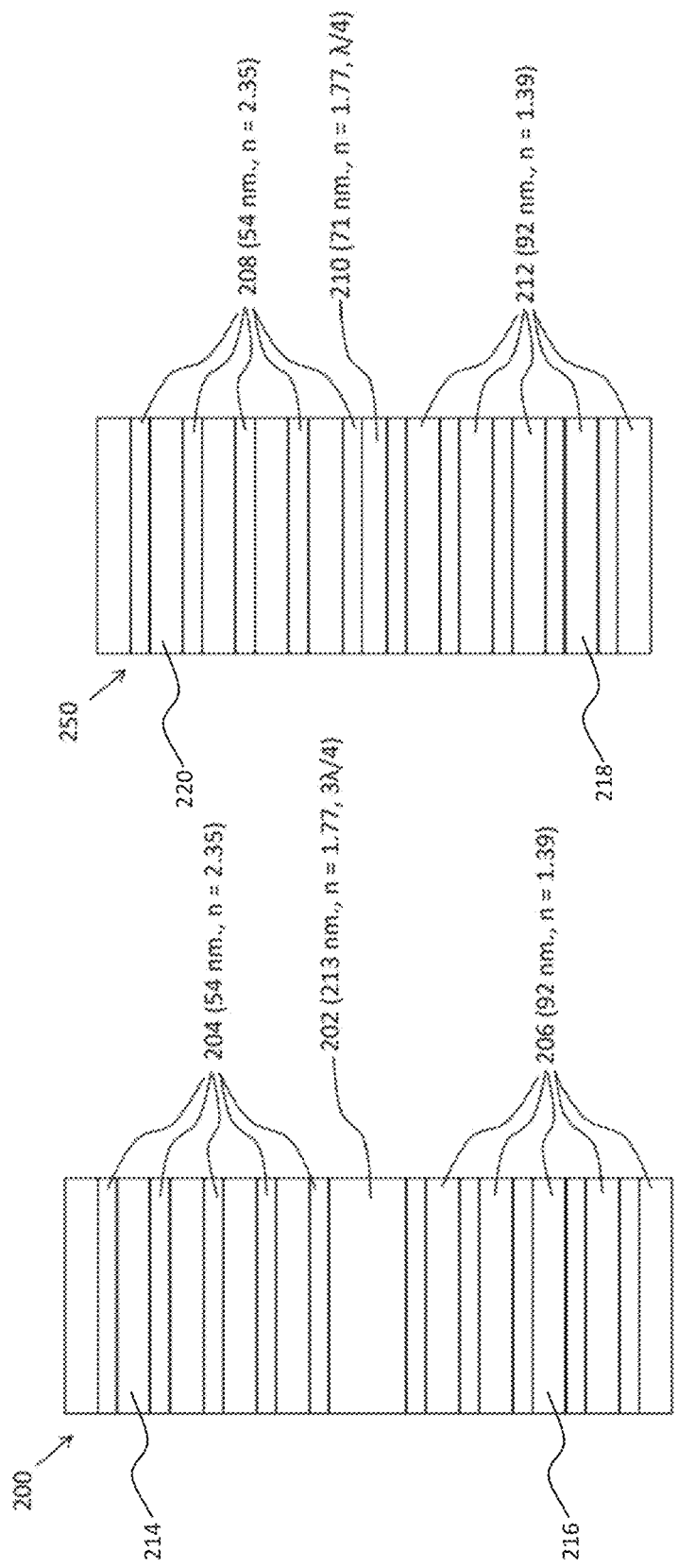
FIG. 2 illustrates a photonic crystal structure that approximates a band edge emitting embodiment in accordance with this disclosure and a photonic crystal structure that approximates a band edge emitting embodiment.

Previously in US Patent Application Document 2018/0183007 it was disclosed that Band Edge Emission Enhanced Organic Light Emitting Diodes (BE-OLEDs) may preferably be fabricated with organic layers (e.g. layer 710 in FIG. 7 in that document) having the same optical thickness of $\lambda/4$ as the other material layers in the device (wherein $\lambda$ is the central wavelength of the stop-band created by the periodic structure of the BE-OLED). Device 250 portrayed in FIG. 2 is a device of this type.

It has been determined that BE-OLED devices may have organic layers may also be allowed to have a layer thickness of $3\lambda/4$ as well. The reason for potentially incorporating this thicker organic layer in the device is that the thickness of the organic sub-layers in layer 710 is primarily dictated by electronic considerations in optimizing OLED performance. It is especially important in blue light emitting devices, because the optical constraint of having a relatively thin organic layer may conflict with the sub-layer thicknesses required for optimum OLED performance.

It can be seen that layers 214 and 216 have the same spatial relationship with each other (in terms of optical thickness) as do layers 220 and 218. These layers also have the same phase relationship with each other. For these reasons the optical stack of device 200 acts as a single photonic crystal producing a stop-band with two band edges in a similar manner to the optical stack of device 250. For the same reasons devices with optical stacks containing layers with thicknesses of not only $3\lambda/4$ but also $5\lambda/4$ and $7\lambda/4$ also function as single photonic crystals.

Surprisingly, we have now learned that incorporating layers of greater optical thickness has a significant performance benefit over thinner layers, optical thickness layers in BE-OLED structures. By adding layers of thickness $3\lambda/4$ or $5\lambda/4$ the width of stop-band created in the BE-OLED is reduced. By reducing a BE-OLED stop-band sufficiently by using thicker layers, it can be used to emit two wavelengths of light at opposite ends of the stop-band.

FIG. 1 illustrates the computer simulated light reflectance spectrum 100 that approximates a BE-OLED 200 with structure shown in FIG. 2. The organic layer 202 with an optical thickness of 382.5 nm. (physical thickness=213 nm.) and a refractive index of 1.77 has an optical thickness of $3\lambda/4$ as compared to the central or design wavelength of the BE-OLED photonic crystal stack at 510 nm. The reflectance spectrum (solid line) of this device is plotted against reflectance spectrum (dashed line) of the equivalent device 250 (prior art from US Patent Application Document 2018/0183007) with an organic layer optical thickness of $\lambda/4$. The stop-band has been narrowed from approximately 167 nm. in width to 132 nm. in width. Accordingly, in the embodiment shown here, the side bands of the stop-band that peak at approximately 438 nm. and 610 nm. are more reflective than in the device with the thinner organic layers.

Figure 3:
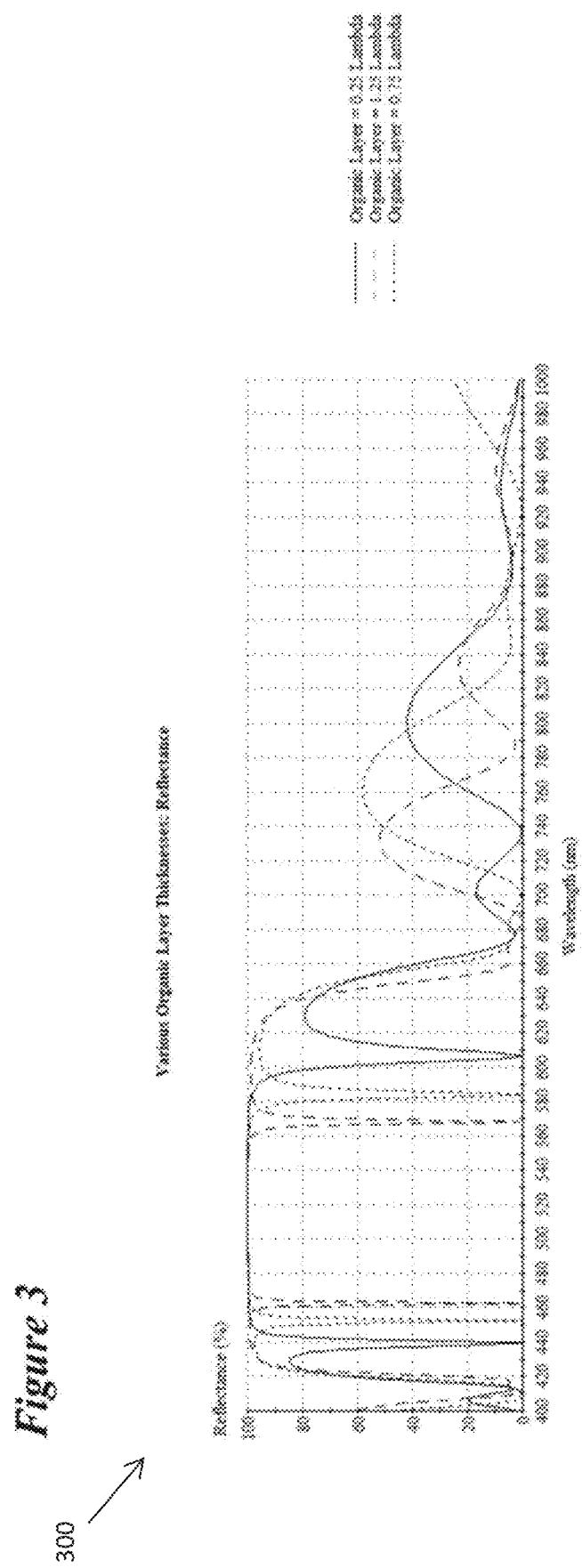
FIG. 3 illustrates a computer modeled reflectance spectra of three photonic crystal structures.

An even thicker organic layer with an optical thickness of $5\lambda/4$ can be used in the device yielding a further decrease in the width of the stop-band as is shown in FIG. 3 in plots 300 of the computer modeled reflectance spectrum of the resulting device in comparison to the modeled spectra for the devices with organic layer thicknesses of $\lambda/4$ and $3\lambda/4$.

Figure 4:
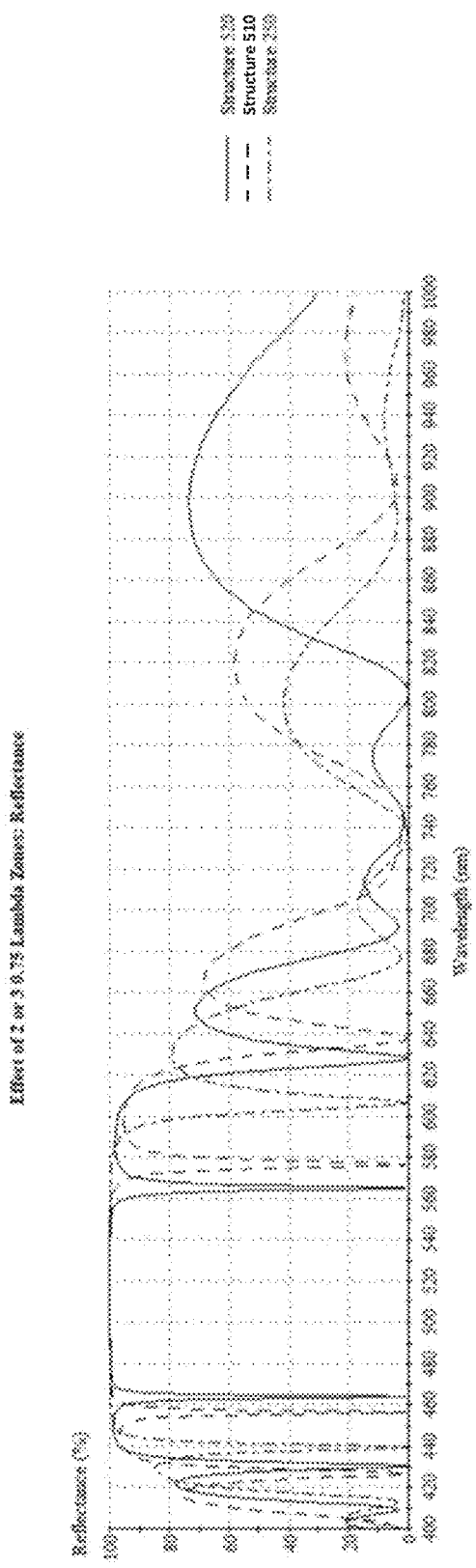
FIG. 4 illustrates a computer modeled reflectance spectra of three photonic crystal structures.
Figure 5:
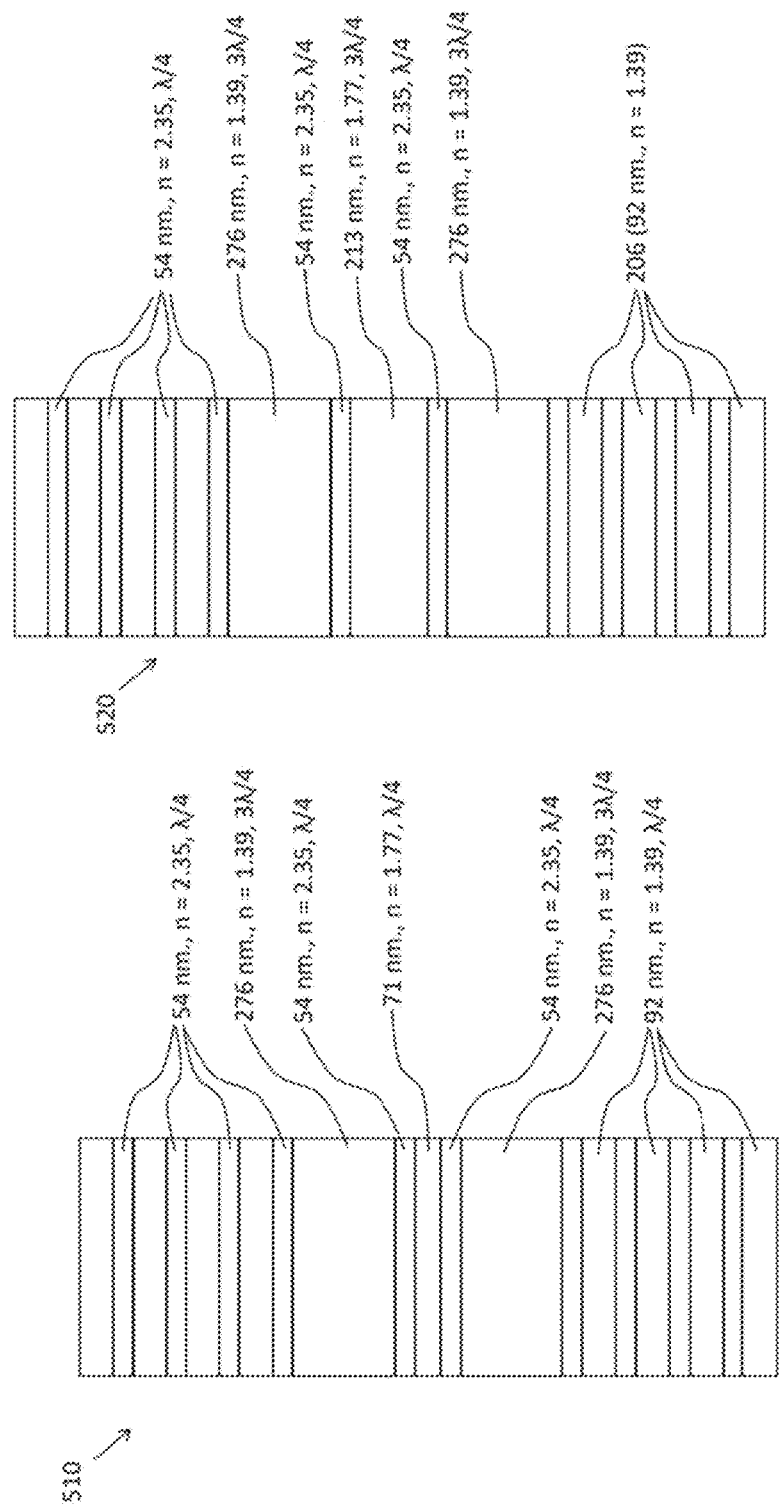
FIG. 5 illustrates two photonic crystal structures that approximate band edge emitting embodiments in accordance with this disclosure.

FIG. 4 shows a plot 400 of the simulated reflectance spectra for structures 510 and 520 that are depicted in FIG. 5 and compares them to the spectrum for structure 250. Structure 510 is similar to structure 250 except that the two n=1.39 (low refractive index) layers nearest the organic layer are thickened to 276 nm. ($3\lambda/4$ optical thickness). Structure 520 is similar to structure 200 except that the two n=1.39 (low refractive index) layers nearest the organic layer (n=1.77) are thickened to 276 nm. ($3\lambda/4$ optical thickness). It can be seen from FIG. 4 that increasing the thickness of layers other than the organic layer from $\lambda/4$ to $3\lambda/4$ also serves to decrease the width of the stop-band of BE-OLED devices.

Figure 6:
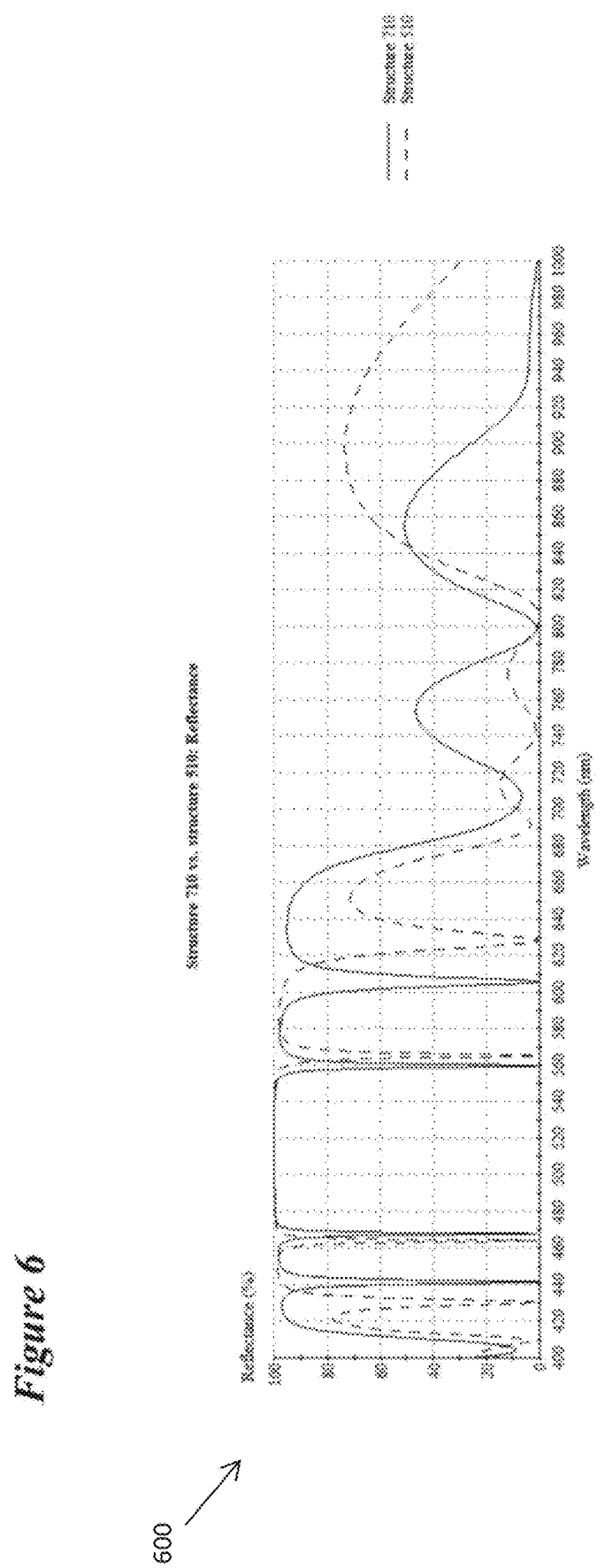
FIG. 6 illustrates a computer modeled reflectance spectra of two photonic crystal structures.
Figure 7:
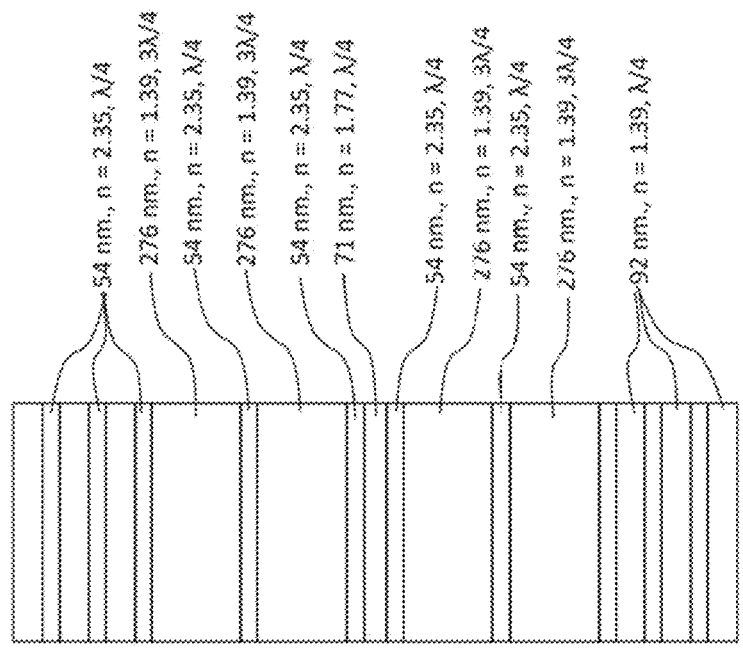
FIG. 7 illustrates a photonic crystal structures that approximates a band edge emitting embodiment of the present invention.

FIG. 6 shows a simulated reflectance spectrum for structure 710 that is depicted in FIG. 7 and compares it to the spectrum for structure 510. Structure 710 is similar to that for 510 except that two additional n=1.39 layers next nearest to the organic layer (n=1.77) are thickened to 276 nm. ($3\lambda/4$ optical thickness). Adding the two additional n=1.77 layers further decreases the width of the photonic stop-band.

Figure 8:
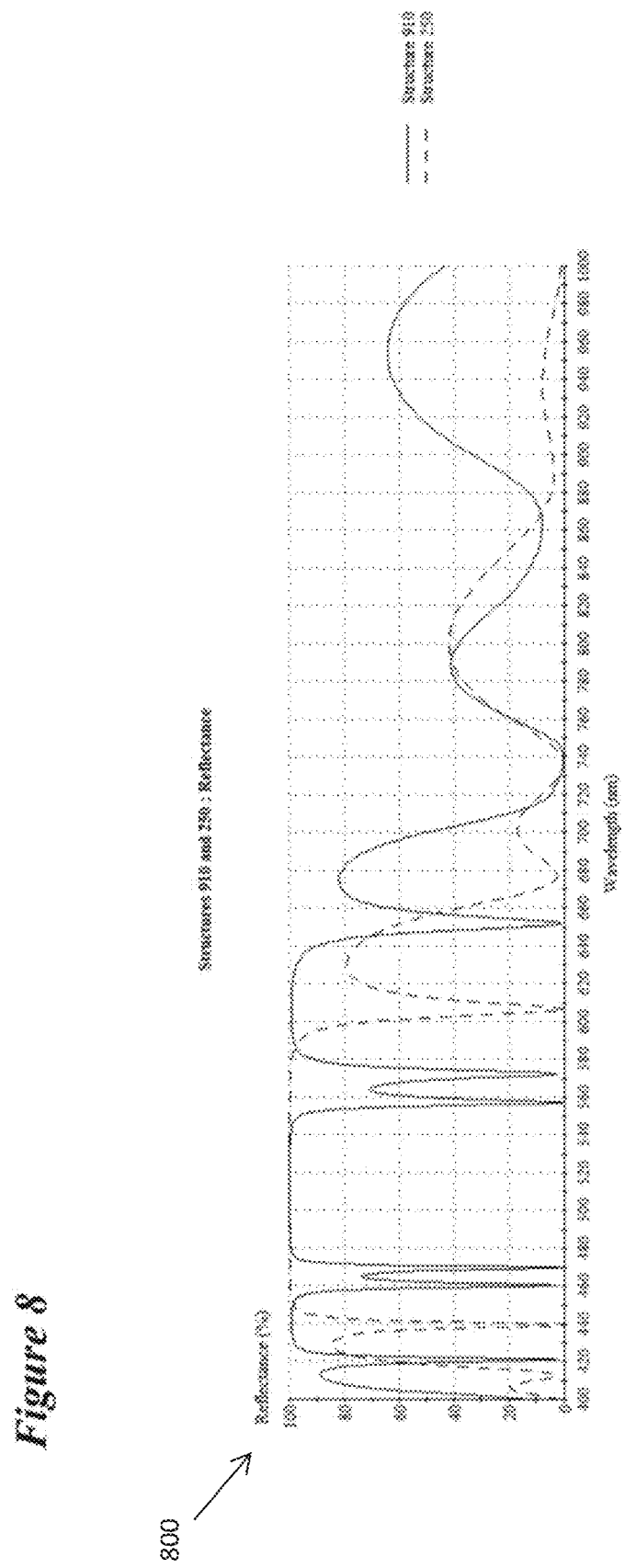
FIG. 8 illustrates a computer modeled reflectance spectra of two photonic crystal structures.
Figure 9:
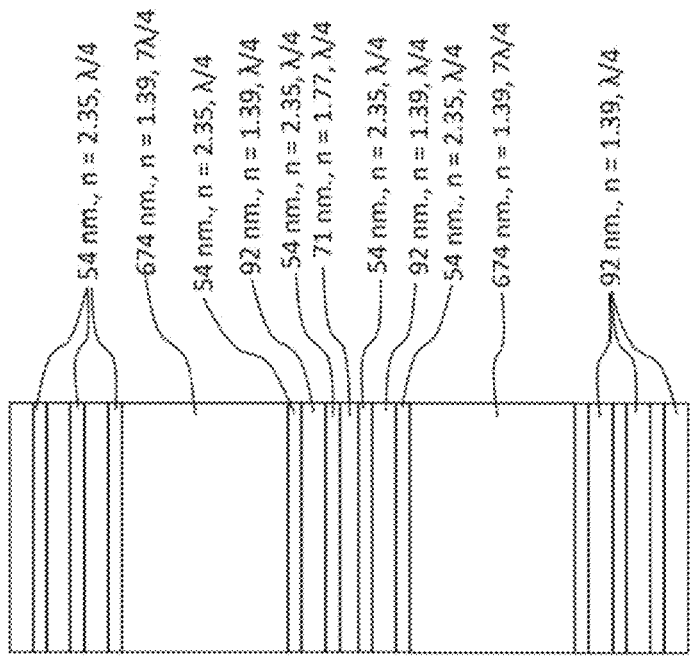
FIG. 9 illustrates a photonic crystal structures that approximates a band edge emitting embodiment of the present invention.

FIG. 8 shows a simulated reflectance spectrum for structure 910 that is depicted in FIG. 9. and compares it to the spectrum for structure 250. Structure 910 is similar to structure 250 except that two of the n=1.39 layers in structure 250 are thickened from 92 nm. to 674 nm. ($7\lambda/4$ optical thickness). As might be expected, this change narrows the width of the stop-band.

Figure 10:
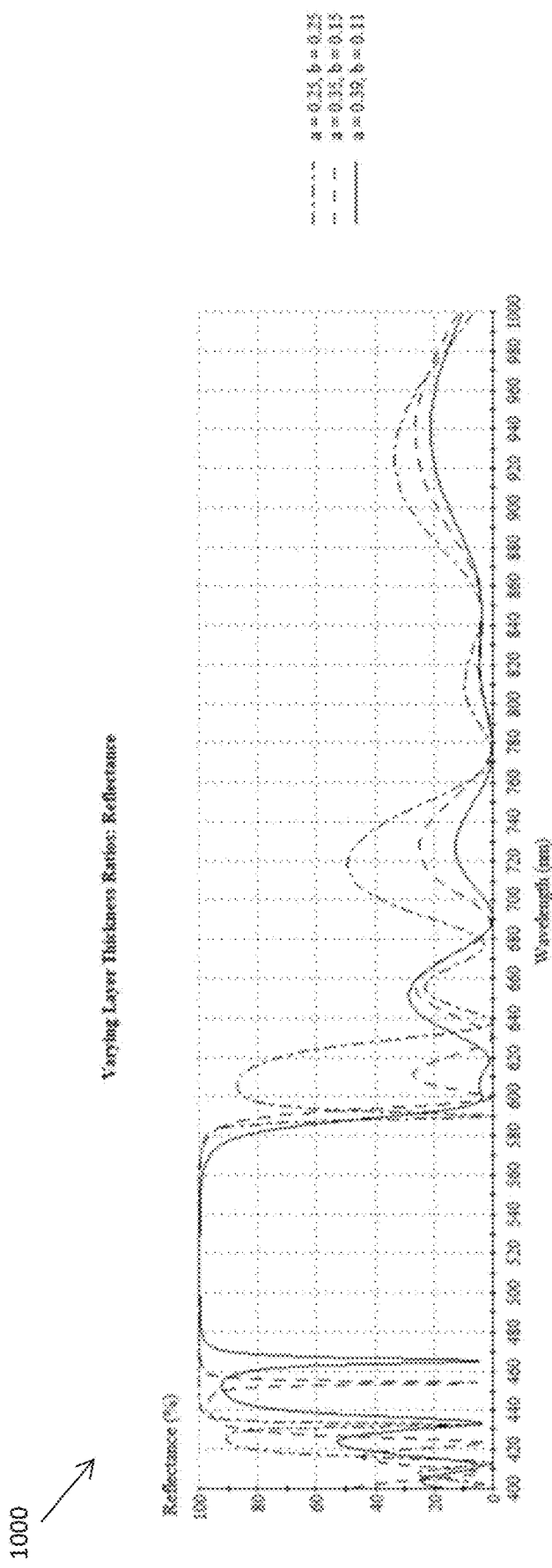
FIG. 10 illustrates a computer modeled reflectance spectra of two photonic crystal structures.
Figure 11:
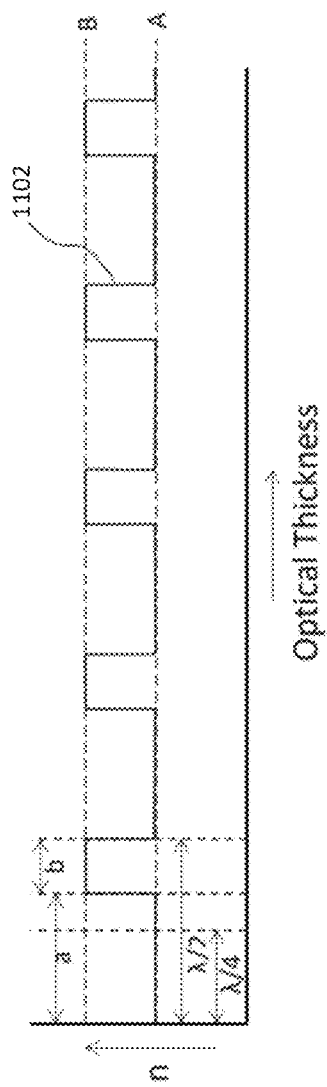
FIG. 11 illustrates a refractive index profile for a portion of a layer stack of an embodiment in accordance with this disclosure.

Another approach to reducing the stop-band width of a light emitting photonic crystal is to change a crystal's profile of periodically varying refractive index in the multilayer stack of the photonic crystal. FIG. 10 shows the effect on a reflectance spectrum of a photonic crystal of changing a ratio of "a", the thickness of the low index (magnesium fluoride, refractive index A) layer, to "b", the thickness of the high index (titanium dioxide, refractive index B) layer in a light emitting photonic crystal comprising alternating magnesium fluoride and titanium dioxide layers built up around an OLED structure while not changing the period of the profile from $\lambda/2$. FIG. 11 portrays the refractive index profile of a layer stack where a b. Reflectance spectra for a=b=$0.25\lambda$; a=$0.35\lambda$, b=$0.15\lambda$; and a=$0.39\lambda$, b=$0.11\lambda$ are shown in FIG. 10. It is evident that the width of the stop-band was decreased by over 30 nm. by changing "a" from $0.25\lambda$ to $0.39\lambda$.

In the description of embodiments of the invention up to this point it has been assumed that the layers comprised by the structures built up on either side of the OLED structure in the single light emitting photonic crystal comprised respectively only two materials, one with a high refractive index and one with a low refractive index. It may be advantageous in the design of the single light emitting photonic crystal to interpose one or more layers of intermediate refractive index between the higher index and lower index layers.

If it is desired to produce a light emitting device that produces light from only one (front) surface, a reflector, for instance a metallic reflector, may be fabricated either between the single light emitting photonic crystal and substrate upon which it is built up or on its opposite surface. If a metallic reflector is used it should be remembered that metallic reflectors introduce a quarter wave shift in the phase of light and therefore the layer directly adjacent to the metal surface should have its optical thickness incremented by an additional thickness equal to λ/4.

The organic layers within a single light emitting photonic crystal in accordance with this disclosure need not be centered in the stack of layers making up the single light emitting photonic crystal and, in fact, may be adjacent to the metallic reflector if one is used. In this case the metallic reflector may function as an electrode or a component of an electrode of the device.

Figure 12:
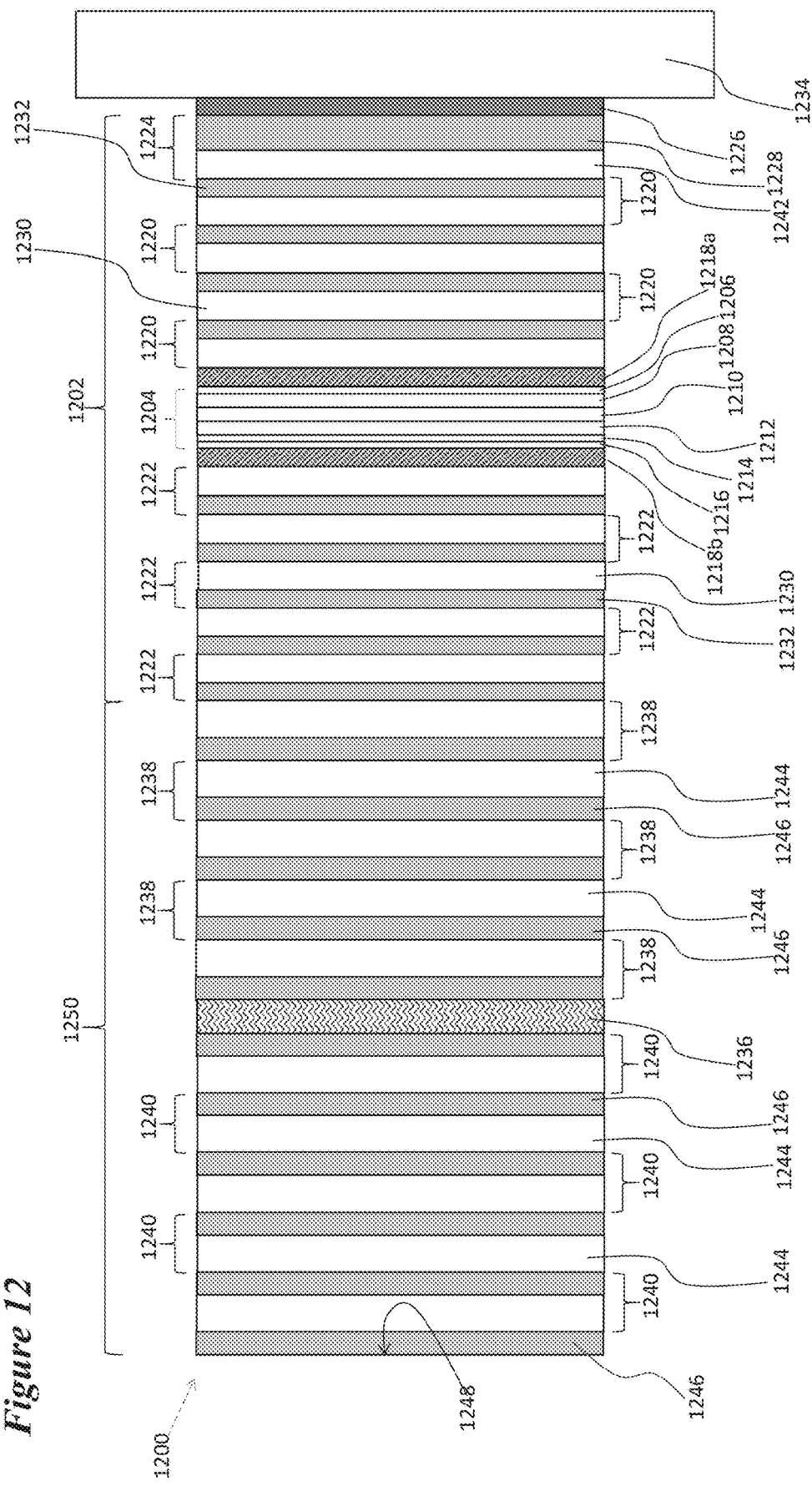
FIG. 12 illustrates aspects of various embodiments in accordance with this disclosure.

FIG. 12 depicts another embodiment 1200 in accordance with this disclosure. BE-OLED 1202, in turn, comprises a conventional OLED. The conventional OLED comprises an anode 1218a that may be composed of a transparent conductive oxide (such as indium-tin oxide or indium-zinc oxide) and a cathode that in turn may comprise a transparent conductive oxide layer 1218b and a very thin low work function metal layer 1216. Other transparent anode and cathode structures may be used so long as the BE-OLED optical structure is not compromised. The conventional OLED structure may further comprise a hole injection layer 1206, a hole transporting layer 1208, a layer 1210 that comprises an electroluminescent material, an electron transporting layer 1212 and an electron injection layer 1216. The conventional OLED structure further may comprise a hole blocking, an electron blocking or an exciton blocking layer (not shown).

In example 1200, BE-OLED 1202 is built up on substrate 1234 by first depositing a specularly reflective metal layer 1226 on substrate 1234. (The presence of this reflector 1226 is optional depending on whether two-sided emission from the device is desired.) Next a pair of transparent material layers 1224 is built up on top of reflective layer 1226. First a layer 1228 of transparent material with a relatively high refractive index is built up on layer 1226 and then a relatively low refractive index layer 1242 built up on layer 1228. Unlike layer 1242 and the other optically functional refractive index zones that are comprised by BE-OLED 1202, layer 1228 may have an optical thickness that is one-half of the center wavelength of the stop-band produced by the photonic crystal structure within BE-OLED 1202. This half wave thickness is intended to make up for the phase shift that occurs in light waves reflected from metallic layer 1226. On the other hand, the other, low refractive index, layer 1242 of material in pair 1224 has an optical thickness of one-quarter of the center wavelength of the stop-band produced by the photonic crystal structure within BE-OLED 1202. We describe the layer pairs in the structure of device 1200 reading from right to left in FIG. 12. Thus, we term layer pair 1224 as a high/low refractive index layer pair.

Four more high/low refractive index layer pairs 1220 are built up on pair 1224. These layer pairs each comprise a comparatively high index layer 1232 and a comparatively low index layer 1230. All the layers 1230 and 1232 have optical thicknesses equal to one quarter the center wavelength of the stop-band produced by the photonic crystal structure within BE-OLED 1202. Next, the layers of a conventional OLED structure are built up in the order, 1218a, 1206, 1208, 1210, 1212, 1214, 1216, and then 1218b. Electrode layers 1218a and 1218b each have optical thicknesses equal to one-quarter the center wavelength of the stop-band produced by the photonic crystal structure within BE-OLED 1202. The other OLED layers 1206, 1208, 1210, 1212, 1214 and 1216 combine to create a single low index zone 104 that has an optical thicknesses equal to one-quarter the center wavelength of the stop-band produced by the photonic crystal structure within BE-OLED 1202. Five more low/high refractive index layer pairs 1222 are built up on the top surface of cathode layer 1218b. Like layer pairs 1220, layer pairs 1222 comprise a relatively low refractive index layer 1230 and relatively high refractive index layer 1232. All the layers in layer pairs 1222 have optical thicknesses equal to one-quarter the center wavelength of the stop-band produced by the photonic crystal structure within BE-OLED 1202. OLED structure 1204 and its associated electrodes need not be centered in photonic crystal 1202 so long as the function of BE-OLED 1202 is not adversely affected and, in fact, may be located adjacent to reflector 1226.

Because the layers in zone 1204 added together produce a single comparatively low refractive index zone with an optical thickness equal to one-quarter the center wavelength of the stop-band produced by the photonic crystal structure within BE-OLED 1202, BE-OLED does, in fact, function as a single photonic crystal. In example embodiment 100 there five high/refractive index pairs on one side of the conventional OLED structure and five low/high refractive index pairs on the other side. Configurations with fewer or greater numbers of alternating refractive index layers are possible and may be advantageous.

Device 1200 further comprises a second 1-D photonic crystal structure 1250 built up on top of BE-OLED 1202. In order to produce photonic crystal 1250 first, five more low/high refractive index layer pairs 1238 are built up on top of the final low/high refractive index layer pair 1222 of BE-OLED 1202. These layers pairs comprise comparatively low refractive index layers 1244 and comparatively high refractive index layers 1246. Next, a comparatively low refractive index layer 1236 comprising a photoluminescent material is built up on top of the stack of layer pairs 1238. Finally, five more high/low refractive index layer pairs 1240 are built up on top of layer 1238. These refractive index layer pairs 1240 also comprise comparatively low refractive index layers 1244 and comparatively high refractive index layers 1246. All the layers of photonic crystal structure 1234 (1244, 1246, and 1236) have the same optical thickness which is one-quarter of the desired center wavelength of the stop-band of photonic crystal structure 1234.

When device 1200 is energized, electrons flow from cathode layer 1218b towards the center of OLED structure 1204 and holes flow from anode layer 1218a towards the same place. The electrons and holes meet in light emitting layer 1210 forming excitons on the electroluminescent material's molecules. The layer thicknesses in the BE-OLED structure are chosen such that one of the band edges of the photonic crystal stop-band overlays the emission band wavelengths of the electroluminescent material. Most often the band edge at the short wavelength end of the stop-band is chosen to overlap the electroluminescent emission band since this allows the layers in the BE-OLED to be thicker and more easily fabricated as well as allowing sufficient thickness for the OLED structure to contain organic layers with functional thicknesses. The electroluminescent material is constrained to emit light into the band edge modes because of the optical environment inside the photonic crystal. Light emitted into the band edge modes builds up inside the photonic crystal structure such that there is sufficient luminous intensity at the light emitting layer to rapidly stimulate light emission from excitons on the luminescent molecules as rapidly as they are formed. Since light emitted into the band edge modes propagates perpendicular to the layer planes in the device, the light from the stimulated emission does the same.

Varying the number of layer pairs in the BE-OLED structure and also varying the refractive index difference between adjoining layers allows one to control the amount of light that escapes the BE-OLED photonic crystal structure. Light that escapes towards reflector 1226 is reflected is reflected back into the BE-OLED structure. Light that escapes in the opposite direction enters photonic crystal structure 1250. In addition, varying the number of layer pairs in the BE-OLED changes the width of the stop-band and thus the wavelengths at which the two band edges occur. Increasing the number of layer pairs decreases the width of the stop-band.

Since the layer thicknesses in structure 1250 create a photonic crystal structure whose stop-band is at wavelengths longer than light emitted by BE-OLED 1202, light emerging from BE-OLED 1202 passes through the first five layer pairs in structure 1250 relatively unimpeded. For instance, the light emitted by BE-OLED 1203 could be violet or blue light while the short wavelength band edge of the photonic crystal structure 1250 could be in the yellow portion of the visible spectrum.

The photoluminescent material in layer 1236 is chosen so that its excitation spectrum overlaps the emission band of BE-OLED 1202. Light entering layer 1236 from BE-OLED 1202 is, in part, absorbed by the photoluminescent material in layer 1236 thus forming excitons on the luminescent molecules. The thicknesses of the layers in structure 1250 are chosen so that the band edge at the short wavelength end of the stop-band of photonic crystal 1250 overlaps the emission spectrum of the photoluminescent material in layer 1236. This material is thus constrained to emit its photoluminescent light into the band edge modes associated with photonic crystal 1250. As was the case in BE-OLED 1202, a portion of the light emitted by layer 1236 builds up in structure 1250 stimulating further light emission from the photoluminescent molecules in layer 1236. Light emitted from structure 1250 backwards towards structure 1202 will either be reflected back by that structure or by reflector 1226. The light not retained in structure 1234 exits surface 1248 as a beam of light spread over a narrow cone of angles. The chromaticity or color temperature of the light exiting surface 1248 may be controlled by varying the concentration of photoluminescent material in layer 1236. The photoluminescent material may be present in all the thickness of layer 1236 or in a thinner sub-layer within layer 1236. The photoluminescent material may also be present in more than one layer in the center of structure 1250.

The light emitted by BE-OLED 1202 may be blue or violet light and the light emitted by structure 1250 may be yellow light. In this case the light emitted from device 1200 will be perceived as white light.

It can be readily seen that structure 1234 may alternatively be placed between BE-OLED 1202 and reflector 1226 if proper layer thickness allowance is made for the optical phase shift at reflector 1226 and if the photonic crystal comprised by BE-OLED does not reflect back light emitted by layer 1236. Also, the configuration of OLED 1204 may be inverted with the cathode facing reflector 1226 and the anode facing structure 1250. It can also be readily seen that a second photonic crystal similar to structure 1250 can built up on top of surface 1248, but this third structure would emit light at a different wavelength than structures 1202 and 1234. For instance, BE-OLED 1202 might emit blue light, structure 1250 might emit green light and both the blue light and green light could pump or excite photoluminescent molecules in the third structure to emit red light into yet a third set of band edge modes of a third photonic crystal. The combined blue, green and red emissions would be perceived as white light, that is to say, light whose CIE 1931 2° XYZ Color Space chromaticity coordinates lie in the rectangle defined by x=0.25 to 0.5 and y=0.2 to 0.45 on the CIE 1931 2° XYZ Color Space Chromaticity Diagram.

Figure 13:
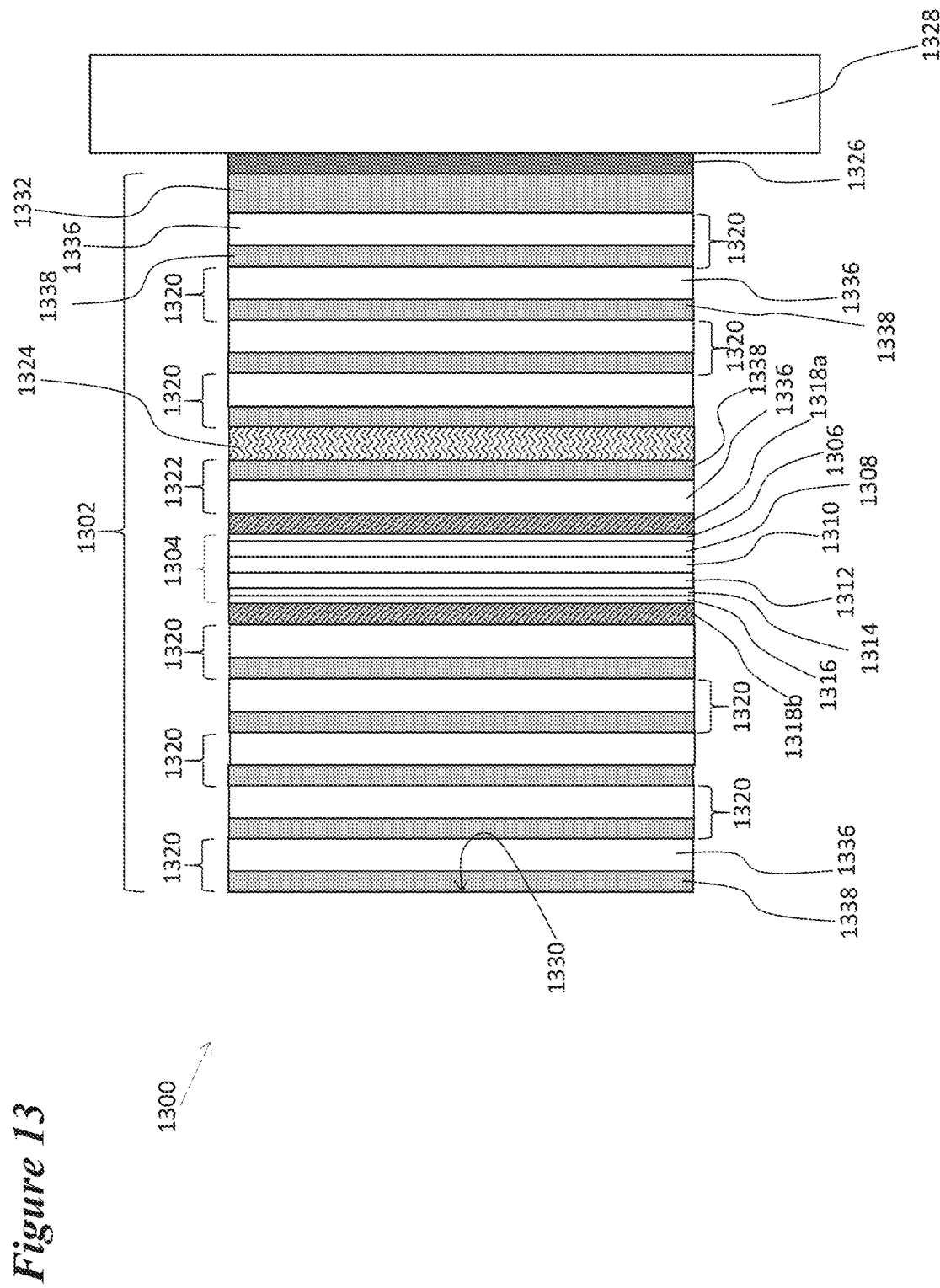
FIG. 13 illustrates aspects of various embodiments in accordance with this disclosure.

FIG. 13 depicts another embodiment of the invention 1300. This device comprises a BE-OLED structure 1302 similar to structure 1202 above but with the addition of a layer 1324 of photoluminescent material. Like BE-OLED 1202, BE-OLED 1302 comprises a conventional OLED. The conventional OLED comprises an anode 1318a that may be composed of a transparent conductive oxide (such as indium-tin oxide or indium-zinc oxide) and a cathode that in turn may comprise a transparent conductive oxide layer 1318b and a very thin low work function metal layer 1316. Other transparent anode and cathode structures may be used so long as the BE-OLED optical structure is not compromised. The conventional OLED structure may further comprise a hole injection layer 1306, a hole transporting layer 1308, a layer 1310 that comprises that electroluminescent material, an electron transporting layer 1312 and an electron injection layer 1316. The conventional OLED structure further may also comprise a hole blocking, an electron blocking or an exciton blocking layer (not shown).

BE-OLED 1302 is built up on substrate 1328 by first depositing a specularly reflective metal layer 1326 on substrate 1328. (The reflective layer 1326 is optional depending on whether two-sided light emission from the device is desired.) A layer of transparent material 1332 is built up on top of reflective layer 1326. Unlike the other optically functional refractive index zones that are comprised by BE-OLED 1302, layer 1332 may have an optical thickness that is one-half of the center wavelength of the stop-band produced by the photonic crystal structure within BE-OLED 1302. This half wave thickness is intended to make up for the phase shift that occurs in light waves reflected from metallic layer 1326

Four refractive index layer pairs 1320 are built up on layer 1332. These layer pairs each comprise a comparatively low index layer 1336 and a comparatively high index layer 1338. All the layers 1336 and 1338 have optical thicknesses equal to one-quarter the center wavelength of the stop-band produced by the photonic crystal structure within BEOLED 1302. We describe the refractive index layer pairs in the structure of device 1300 reading from right to left in FIG. 13. Thus, we term layer pair 1320 as a low/high refractive index layer pair.

Next a layer 1324 comprising a photoluminescent material is built up on top of the last refractive index layer pair 1320. This layer 1324 has a relatively low refractive index as compared to the layers on either side of it. Then a high/low refractive index layer pair 1322 comprising layers 1338 and 1336 is built up on top of layer 1324.

Next, the layers of a conventional OLED structure are built up in the order, 1318a, 1306, 1308, 1310, 1312, 1314, 1316, and then 1318b. Electrode layers 1318a and 1318b each have optical thicknesses equal to one-quarter the center wavelength of the stop-band produced by the photonic crystal structure within BE-OLED 1302. The other OLED layers 1306, 1308, 1310, 1312, 1314 and 1316 combine to create a single low index zone 1304 that has an optical thicknesses equal to one-quarter the center wavelength of the stop-band produced by the photonic crystal structure within BE-OLED 1302. Five more low/high refractive index layer pairs 1320 are built up on the top surface of cathode layer 1318b. All the layers in layer pairs 1320 and 1322 have optical thicknesses equal to one-quarter the center wavelength of the stop-band produced by the photonic crystal structure within BE-OLED 1302. OLED structure 1304 and its associated electrodes need not be centered in photonic crystal 1302 so long as the function of BE-OLED 1302 is not adversely affected and, in fact, may be located adjacent to reflector 1326.

Because the layers in zone 1304 added together produce a single comparatively low refractive index zone with an optical thickness equal to one-quarter the center wavelength of the stop-band produced by the photonic crystal structure within BE-OLED 1302, BE-OLED 1302 does, in fact, function as a single photonic crystal.

When device 1300 is energized, electrons flow from cathode layer 1318b towards the center of OLED structure 1304 and holes flow from anode layer 1318a towards the same place. The electrons and holes meet in light emitting layer 1310 forming excitons on the electroluminescent material's molecules. The layer thicknesses in the BE-OLED structure are chosen such that the band edge at the short wavelength end of the stop-band of the photonic crystal overlays the emission band wavelengths of the electroluminescent material. The electroluminescent material is constrained to emit light into the band edge modes because of the optical environment inside the photonic crystal. Light emitted into the band edge modes builds up inside the photonic crystal structure such that there is sufficient luminous intensity at the light emitting layer to rapidly stimulate light emission from excitons on the luminescent molecules in layer 1310 as rapidly as they are formed. Since light emitted into the band edge modes propagates perpendicular to the layer planes in the device, the light from the stimulated emission does the same.

The light from light emitting layer 1310 that is retained in the photonic crystal structure of device 1300 is in part absorbed by the photoluminescent material in layer 1324 creating excitons that decay producing light. The photoluminescent material in layer 1324 is chosen so that its emission spectrum overlaps the long wavelength band edge of the stop-band of the photonic crystal comprised by device 1300. The photoluminescent material in layer 1324 is thereby constrained to emit light only into the band edge modes of the photonic crystal. As was the case with the light produced in layer 1310, light emitted into the band edge modes builds up inside the photonic crystal structure such that there is sufficient luminous intensity at layer 1324 to stimulate light emission from excitons on the luminescent molecules in that layer as rapidly as they are formed. Since light emitted into the band edge modes at the long wavelength band edge propagates perpendicular to the layer planes in the device, the light from the stimulated emission in layer 1324 does the same.

Because light emission in device 1300 occurs at both band edges of the stop-band, device 1300 emits light at two separate wavelengths. For instance, a device may be produced that emits violet or blue light in the short wavelength band edge modes and red light in the long wavelength band edge modes. By varying the concentration of photoluminescent material in layer 1324 ratio of the amount of short wavelength light to the amount of long wavelength light produced may be varied.

Varying the number of layer pairs in the BE-OLED structure 1300 and also varying the refractive index difference between adjoining layers allows one to control the amount of light retention in the BE-OLED photonic crystal structure. (We have learned that varying the number of layer pairs may change the width of the stop-band created by the photonic crystal. We have discovered that, surprisingly, adding more layer pairs narrows the spectral width of the stop-band. Thus, by modulating the layer thicknesses and number of layer pairs, one can tailor the width of the stop-band in a predictable and controllable manner, which was not previously appreciated. One would have expected that increasing layer thickness would have no effect if the layer thickness was modified by multiples of $\lambda/2$.) In device 1300 in FIG. 13, the photoluminescent layer 1324 is located between OLED structure 1304 and reflector 1326. It can be readily seen that layer 1324 may alternatively be placed between OLED structure 1304 and emissive surface 1330. Also, the configuration of OLED 1304 may be inverted with the cathode facing reflector 1326 and the anode facing emissive surface 1330.

In a variation of BE-OLED structure 1300 the second luminescent material in the device, equivalent to that in layer 1324 in FIG. 13, emits light, at least in part, through electroluminescence rather than photoluminescence. In order to achieve this the second material must be located in very close proximity to the electroluminescent material in layer 1310 and thus is not in a separate layer like layer 1324 that optically functions as a separate quarter wave thickness layer of the device. Most often there is a separate very thin layer comprising the second electroluminescent material and one or more host materials located directly adjacent to emitter layer 1310. Alternatively, the second electroluminescent material may actually be comprised by layer 1310 or be in a layer separated from layer 1310 by another very thin layer. In any case layer 1310, a layer comprising the second luminescent material and other associated layers of organic material functioning similarly to layers 1306, 1308, 1312, 1314 and 1316 still need to combine to form a single low refractive index zone with a thickness equal to one quarter of the center wavelength of the stop-band produced by the photonic crystal structure within BE-OLED 1302.

In this alternative version of device 1300 the molecules of the second electroluminescent material are energized to light emission when excited state energy is transferred to them from the first electroluminescent material of layer 1310 by Förster (dipole-dipole coupling mediated) or Dexter (electron transfer mediated) exciton transfer although some energy transfer through light emission by the electroluminescent material of layer 1310 and absorption by the second electroluminescent material may also be possible. As was the case with the luminescent material in layer 1324, the second electroluminescent material is chosen so that its emission spectrum overlaps the long wavelength band edge of the stop-band of the photonic crystal comprised by device 1300. The second electroluminescent material is thereby constrained to emit light only into the long wavelength band edge modes of the photonic crystal. As was the case with the light produced in layer 1324, light emitted into the band edge modes builds up inside the photonic crystal structure such that there is sufficient luminous intensity at the layer containing the second luminescent material to stimulate light emission from excitons on the luminescent molecules in that layer as rapidly as they are formed. As was the case with device 1300 light is emitted in both the long and short wavelength emission bands on either side of the device stop-band.

Figure 14:
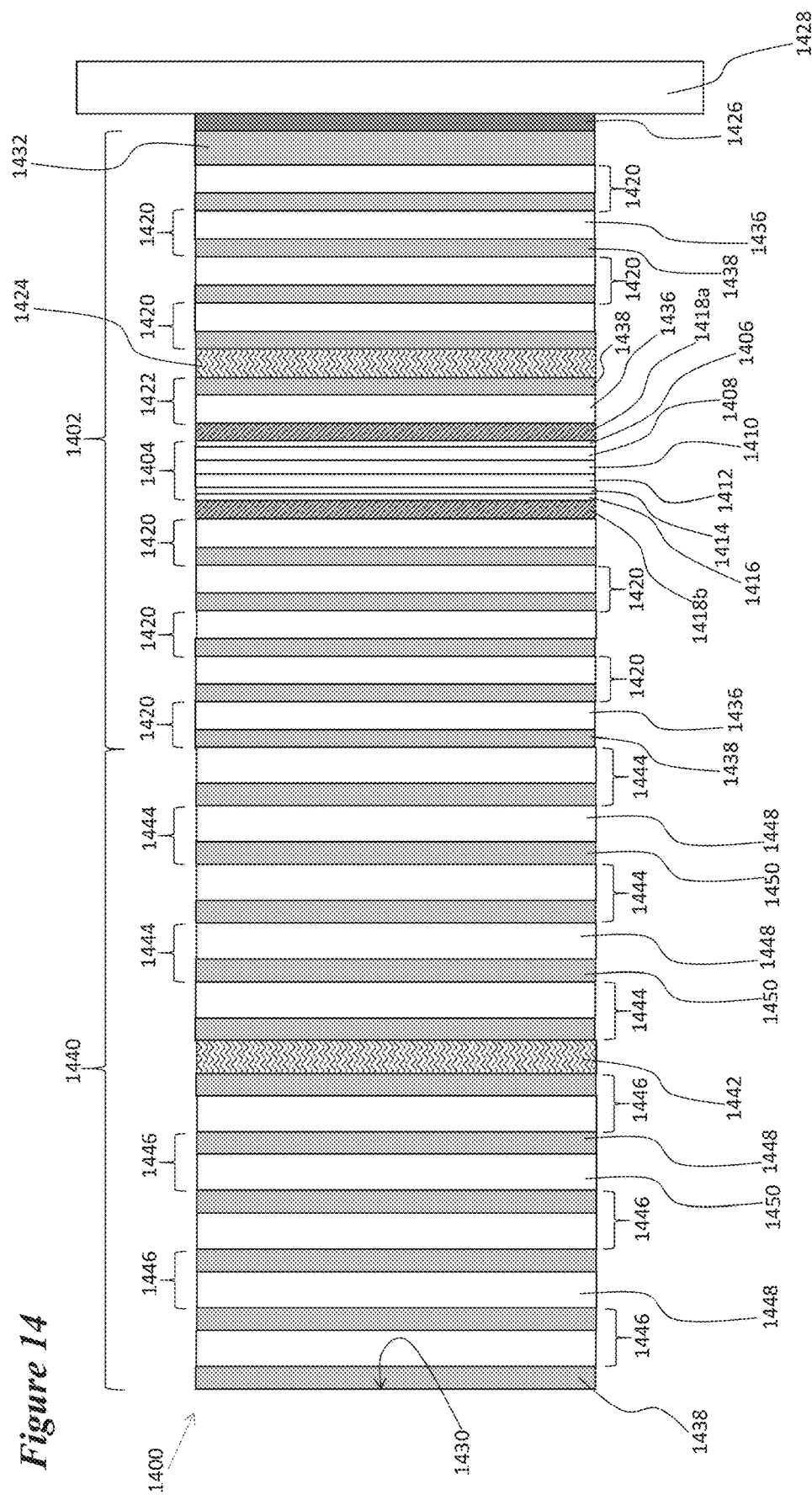
FIG. 14 illustrates a computer modeled reflectance spectra of two photonic crystal structures.

FIG. 14 depicts yet another embodiment 1400 of the invention. Device 1400 combines the functions of device 1200 with those of device 1300 yielding a device capable of emitting three wavelengths of light, for instance red, green and blue.

The structure of BE-OLED 1402 is essentially the same as that of device 1300. The layers in structure 1404, layer pairs 1420 and 1422, and electrodes 1418a and 1418b all perform the same functions as the equivalent structures; the layers in structure 1304, layer pairs 1320 and 1322, and electrodes 1318a and 1318b; found in device 1300. The photonic crystal structure 1440 functions in essentially the same way as structure 1250 in device 1200. Layer pairs 1444 and 1446 and layer 1442 serve essentially the same purpose as layer pairs 1238 and 1240 and layer 1236 in device 1200.

When device 1400 is energized, electrons flow from cathode layer 1418b towards the center of OLED structure 1404 and holes flow from anode layer 1418a towards the same place. The electrons and holes meet in light emitting layer 1410 forming excitons on the electroluminescent material's molecules. The layer thicknesses in the BE-OLED structure are chosen such that the band edge at the short wavelength end of the stop-band of the photonic crystal overlays the emission band wavelengths of the electroluminescent material. The electroluminescent material is constrained to emit light into the band edge modes because of the optical environment inside the photonic crystal. Light emitted into the band edge modes builds up inside the photonic crystal structure such that there is sufficient luminous intensity at the light emitting layer to rapidly stimulate light emission from excitons on the luminescent molecules in layer 1410 as rapidly as they are formed. Since light emitted into the band edge modes propagates perpendicular to the layer planes in the device, the light from the stimulated emission does the same.

The light from light emitting layer 1410 that is retained in the photonic crystal structure of BE-OLED 1402 is in part absorbed by the photoluminescent material in layer 1424 creating excitons that decay producing light. The photoluminescent material in layer 1424 is chosen so that its emission spectrum overlaps the long wavelength band edge of the stop-band the photonic crystal comprised by structure 1402. The photoluminescent material in layer 1424 is thereby constrained to emit light only into the band edge modes of the photonic crystal. As was the case with the light produced in layer 1410, light emitted into the band edge modes builds up inside the photonic crystal structure such that there is sufficient luminous intensity at layer 1424 to stimulate light emission from excitons on the luminescent molecules in that layer as rapidly as they are formed. Since light emitted into the band edge modes at the long wavelength band edge propagates perpendicular to the layer planes in the device, the light from the stimulated emission in layer 1424 does the same. The photoluminescent material may be present in all the thickness of layer 1424 or in a thinner sub-layer within layer 1424. Varying the number of layer pairs in the BE-OLED structure 1402 and also varying the refractive index difference between adjoining layers allows one to control the amount of light that escapes the BE-OLED photonic crystal structure. Light that escapes towards reflector 1426 is reflected is reflected right back into the BE-OLED structure 1402. Light that escapes in the opposite direction enters photonic crystal structure 1440.

The layer thicknesses in structure 1440 are chosen to create a photonic crystal structure whose stop-band is at wavelengths longer than the two wavelengths of light emitted by BE-OLED 1402. Thus, light emerging from BE-OLED 1402 passes through the first five layer pairs in structure 1440 relatively unimpeded.

The photoluminescent material in layer 1442 is chosen so that its excitation spectrum overlaps one or both emission bands of BE-OLED 1402. Light entering layer 1442 from BE-OLED 1402 is, in part, absorbed by the photoluminescent material in layer 1436 thus forming excitons on the luminescent molecules. The thicknesses of the layers in structure 1440 are chosen so that the band edge at the short wavelength end of the stop-band of photonic crystal 1440 overlaps the emission spectrum of the photoluminescent material in layer 1442. This material is thus constrained to emit its photoluminescent light into the band edge modes associated with photonic crystal 1440. As was the case in BE-OLED 1402, a portion of the light emitted by layer 1442 is builds up in structure 1440 stimulating further light emission from the photoluminescent molecules in layer 1442. Light emitted from structure 1440 backwards towards structure 1402 will be reflected back by reflector 1426. The light not retained in structure 1440 exits surface 1430 as a beam of light spread over a narrow cone of angles. The chromaticity or color temperature of the light exiting surface 1430 may be controlled by varying the concentration of photoluminescent material in layers 1424 and 1442. The photoluminescent material may be present in all the thickness of layer 1442 or in a thinner sub-layer within layer 1442. The photoluminescent material may also be present in more than one layer in the center of structure 1440.

As was the case with device 1300 an alternative variation of device 1400 may omit layer 1424 replacing it with a second electroluminescent material in close proximity to layer 1410. This material would also emit light into the band edge modes at the long wavelength edge of the stop-band of the photonic crystal structure of layer assembly 1402.

In device 1400 the primary source of excitons in structure 1402 is the light emitting material with the shortest wavelength of light emission of the three luminescent materials used in the device. Since short wavelength (e.g. blue or violet) emitters are in some cases the least efficient and since the greatest sensitivity of the human eye is in the green to yellow wavelengths, it may be desirable that primary source of excitons in an RGB emitting device be a luminescent material that emits in the green to yellow wavelength range. An RGB emitting device meeting this requirement can consist of a conventional blue light emitting BE-OLED overlayed with a green and red light emitting BE-OLED having the structure of embodiment 1300.

In referring to light emitting or electroluminescent materials in describing embodiments 1200, 1300, and 1400 the term materials is not meant to be limited to substances comprising a single molecular species. Considerable progress has been made recently in developing electroluminescent exciplexes that comprise multiple molecular species and the term materials is meant to describe these and other electroluminescent materials comprising multiple molecular species as single light emitting molecular species.

It is clear that the spectral distribution output wavelengths of embodiments 1300 and 1400 will strongly depend on the width of the stop-bands produced by the photonic crystal structures. The square wave profiles of the structures in embodiments 1200, 1300, and 1400 yield stop-bands that are quite wide spectrally, over 200 nm. A strategy to reduce the spectral width of the stop-bands is to alter the profile of the refractive index alternation. As discussed above, the graph shown in FIG. 11 depicts a method of reducing the width of a stop-band in a photonic crystal of the invention. The figure shows the refractive index versus thickness plot of an alternative refractive index profile 1102 for a photonic crystal. The period of refractive index variation remains at $\lambda/2$ wherein $\lambda$ is the central wavelength of the photonic crystal stop-band. However, the optical thickness a of the low index layers of material A is $\lambda/4<a<\lambda/2$ and the thickness b of the high index layers of material is $0<b<\lambda/4$. FIG. 5 depicts computer simulated reflection from the photonic crystal structure versus wavelength for varying ratios of layer thicknesses a to b where a+b=0.50. It is clear that as the ratio of a to b increases the width of the stop-band produced by photonic crystal structure of the BE-OLED will decrease. These simulations were produced using a refractive index of 1.39 for the low index material (e.g. MgF2) and of 2.36 for the high index material (e.g. TiO2) because modeling program limitations the refractive indices of the cathode and anode transparent metal oxide layers were also set at 2.36 and the organic layer was modeled as having a uniform refractive index of 1.80.

Figure 15:
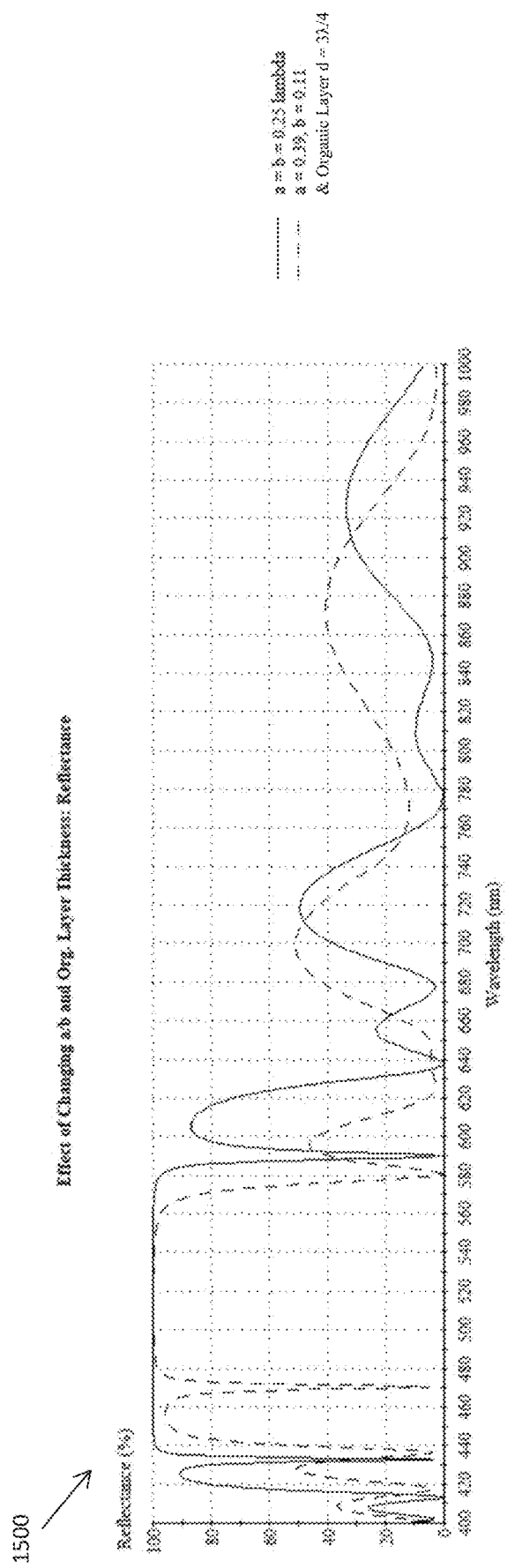
FIG. 15 illustrates a computer modeled reflectance spectrum a photonic crystal stack that approximates a band edge emitting device embodiment in accordance with this disclosure and that uses two different methods of tuning stop-band spectral width.

Another approach to reducing the spectral width of the stop-band produced by the photonic crystal structure of a BE-OLED is increase the thickness of one or more of the layers of the photonic crystal structure having optical thicknesses of $\lambda/4$ by increments of $\lambda/2$ yielding layers with optical thicknesses of $3\lambda/4$, $5\lambda/4$, or $7\lambda/4$ as discussed above and demonstrated, for instance, in FIG. 1. This can also prove useful when producing the blue light emitting BE-OLED structure 1402 in device 1400 since increasing the thickness of the organic layer 1404 allow more freedom in choosing sub-layer thicknesses to optimize the electronic function of the device. The approaches of altering the a to b ratio and also increasing a layer thickness by $\lambda/2$ may be combined. For example, the results for a device with a=0.39 and b=0.11 with an organic layer optical thickness of $3\lambda/4$ or 375 nm. are plotted in FIG. 15. The reflectance band for this device is plotted against the device with a=b=0.25 and organic layer optical thickness of $\lambda/4$ for comparison.

Figure 16:
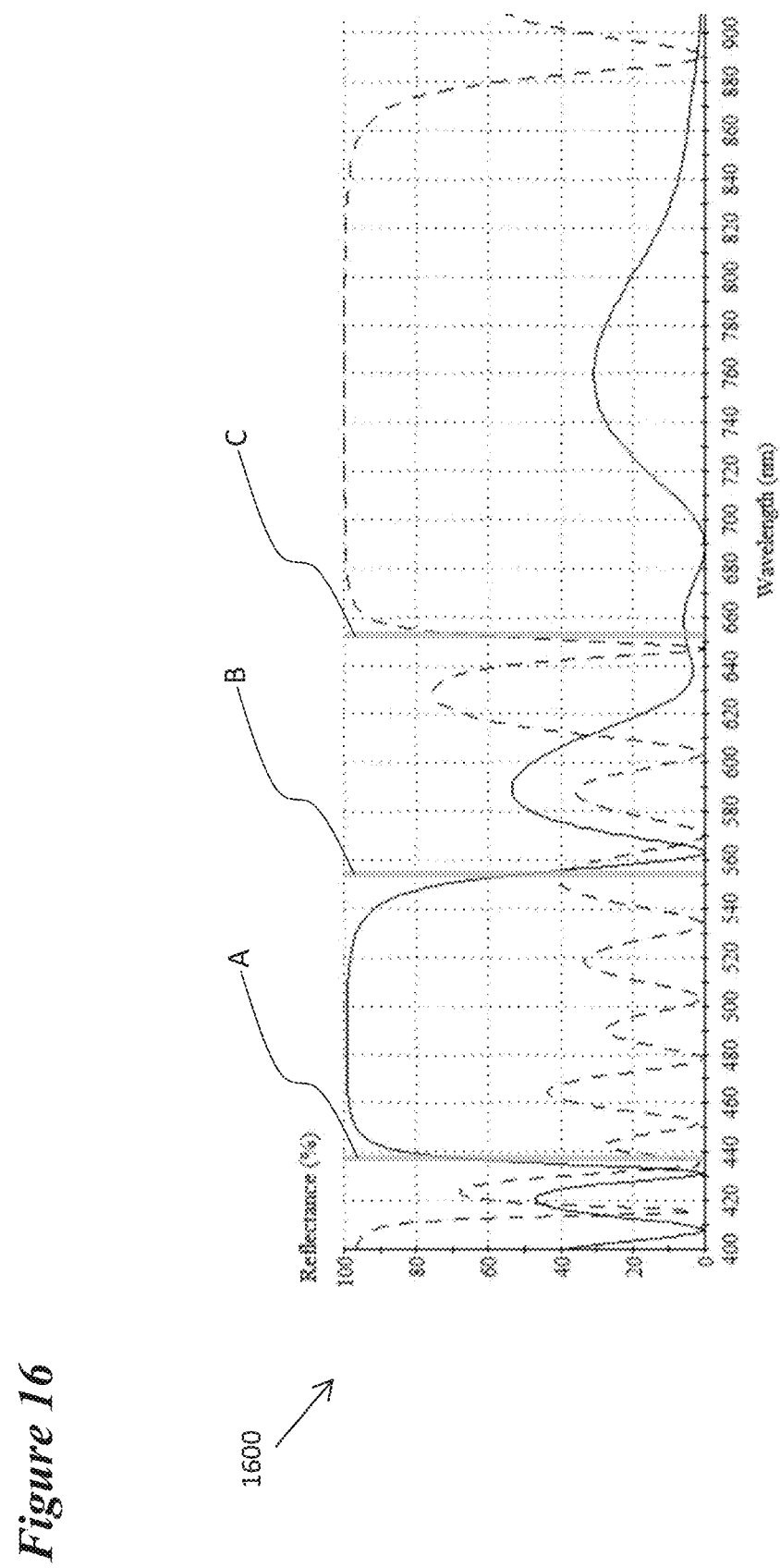
FIG. 16 illustrates the combined reflectance spectrum for a light emitting device in accordance with this disclosure.

FIG. 16 shows the combined reflectance spectrum for a light emitting device similar to device 1400 in FIG. 14. Light is emitted in the three photonic crystal band edge emission bands A, B and C.

In various embodiments an organic light emitting diode device comprises a single light emitting photonic crystal that further comprises an organic electroluminescent emitter material disposed within the single light emitting photonic crystal, wherein the electroluminescent emitter material is localized in a zone that has an optical thickness of less than 10% of the total optical thickness of the photonic crystal. In these embodiments the organic electroluminescent emitter material has a free space emission spectrum that at least in part overlaps the stop-band of the photonic crystal and the photonic crystal emits light at a wavelength corresponding to an edge of the stop-band that the organic electroluminescent emitter material overlaps. Also, in these embodiments the single light emitting photonic crystal is made up of a stack of layers of varying refractive index in which a layer of lower refractive index contains the organic electroluminescent emitter material.

In various embodiments of a light emitting device in accordance with this disclosure a layer of lower refractive index in the first single light emitting photonic crystal that contains the organic electroluminescent emitter material may also comprise additional organic materials each having a low index of refraction relative to an adjacent layer, wherein organic materials are at least one of a charge carrier transport material, a charge carrier injection material, or a charge carrier injection material.

In various embodiments of a light emitting device in accordance with this disclosure a single light emitting photonic crystal contained in the organic light emitting diode device comprises a stack of layers having a periodic modulation of refractive index of period $\lambda/2$, where $\lambda$ equals the central wavelength of the photonic crystal stop-band. This modulation is uniformly periodic, not in terms of the physical thickness of the layers, but in terms of their optical thickness. While the layers comprised by one period of modulation may be two in number and of equal thickness, the layers may be two in number and of unequal optical thickness with the result that the width of the stop-band that is created is reduced. There may also be more than two layers comprised by one period of optical thickness modulation.

In various embodiments of a light emitting device in accordance with this disclosure a single light emitting photonic crystal contained in the organic light emitting diode device may comprise one or more material layers with optical thicknesses equal to $(2n+1)\lambda/2$ where n may have values between 1 and 3 and $\lambda$ equals the central wavelength of the photonic crystal stop-band. While the presence of these layers does not stop the layer stack from functioning as a single photonic crystal, it does serve to reduce the width of the stop-band of the photonic crystal. Between one and seven of these $(2n+1)\lambda/2$ thickness layers may introduced depending on the stop-band width narrowing required and these total number of layers in the photonic crystal. One of the $(2n+1)\lambda/2$ thickness layers may contain the organic electroluminescent emitter material.

In various embodiments of a light emitting device in accordance with this disclosure a single light emitting photonic crystal contained in the organic light emitting diode device may comprise a distributed Bragg reflector.

In various embodiments of a light emitting device in accordance with this disclosure a single light emitting photonic crystal contained in the organic light emitting diode device may have periodic modulation of refractive index that takes the form of a square wave modulation. If present, this modulation is uniformly periodic, not in terms of the physical thickness of the layers, but in terms of their optical thickness.

In various embodiments of a light emitting device in accordance with this disclosure a single light emitting photonic crystal contained in the organic light emitting diode device the axis of transmission of the emitted light may be perpendicular to the layers comprised by the single light emitting photonic crystal.

In various embodiments of a light emitting device in accordance with this disclosure a single light emitting photonic crystal contained in the organic light emitting diode device the molecules of the organic electroluminescent emitter material may be spatially oriented to maximize stimulated emission parallel to the axis of transmission of the emitted light.

In various embodiments of a light emitting device in accordance with this disclosure a single light emitting photonic crystal contained in the organic light emitting diode device may comprise an organic light emitting diode such that the electrodes and organic layers of the organic light emitting diode form part of the structure having periodically varying refractive index.

In various embodiments of a light emitting device in accordance with this disclosure a single light emitting photonic crystal contained in the organic light emitting diode device has a band edge of the stop-band that may occur at a wavelength at which the measured free space radiance of the luminescence light emitted by the electroluminescent emitter is greater than one-quarter of the measured peak free space radiance of the luminescence emission spectrum of the emitter material.

In various embodiments of a light emitting device in accordance with this disclosure a single light emitting photonic crystal contained in the organic light emitting diode device has a band edge of the stop-band that may occur at a wavelength at which light absorption for a single passage of light through the emitter layer is less than 1%.

In various embodiments of a light emitting device in accordance with this disclosure a single light emitting photonic crystal contained in the organic light emitting diode device has a band edge of the stop-band that may occur at a wavelength at which light absorption for a single passage of light through the emitter layer is less than ½%.

In various embodiments of a light emitting device in accordance with this disclosure a single light emitting photonic crystal contained in the organic light emitting diode device may comprise a layer of organic materials that is centered in the stack of layers that are comprised by said single light emitting photonic crystal. The layer of organic materials may contain the organic electroluminescent emitter material.

In various embodiments of a light emitting device in accordance with this disclosure a single light emitting photonic crystal contained in the organic light emitting diode device may comprise a layer of organic materials that is off-center in the stack of layers that are comprised by said single light emitting photonic crystal. The layer of organic materials may contain the organic electroluminescent emitter material.

In various embodiments of a light emitting device in accordance with this disclosure a single light emitting photonic crystal contained in the organic light emitting diode device may comprise a layer of organic materials that is adjacent to a layer of reflective metal. The layer of organic materials may contain the organic electroluminescent emitter material.

In various embodiments of a light emitting device in accordance with this disclosure a single light emitting photonic crystal contained in the organic light emitting diode device may have a periodic modulation of the refractive index of light and the single light emitting photonic crystal may contain sufficient periods of periodic modulation to produce a stop-band with short wavelength and long wavelength band edges that are less than 160 nanometers apart.

In various embodiments of a light emitting device in accordance with this disclosure a single light emitting photonic crystal contained in the organic light emitting diode device may have a periodic modulation of the refractive index of light and the single light emitting photonic crystal may contain sufficient periods of periodic modulation to produce a stop-band with short wavelength and long wavelength band edges that are less than 110 nanometers apart.

In various embodiments of a light emitting device in accordance with this disclosure a single light emitting photonic crystal contained in the organic light emitting diode device may have a periodic modulation of the refractive index of light and the single light emitting photonic crystal may contain sufficient periods of periodic modulation to produce a stop-band with short wavelength and long wavelength band edges that are less than 70 nanometers apart.

In various embodiments of a light emitting device in accordance with this disclosure includes a first single light emitting photonic crystal having an organic electroluminescent emitter material disposed within the single photonic crystal with the organic electroluminescent emitter material contained in a zone having less than 10% of the total optical thickness of the photonic crystal. In these embodiments the organic electroluminescent emitter material in the first single light emitting photonic crystal has a free space emission spectrum that at least in part overlaps the stop-band of that photonic crystal and that photonic crystal emits light at a wavelength corresponding to an edge of the stop-band that the organic electroluminescent emitter material overlaps. In these embodiments the first single light emitting photonic emitting crystal is made up of a stack of layers of varying refractive index in which a layer of lower refractive index contains the organic electroluminescent emitter material. In these embodiments the light emitting device further comprises one or more other single light emitting photonic crystals each having a photoluminescent material disposed within the single photonic crystal wherein in each of the other single light emitting photonic crystals the photoluminescent material has a free space emission spectrum that at least in part overlaps the stop-band of that photonic crystal. In these embodiments each of the other single light emitting photonic crystals emits light at a wavelength corresponding to the edge of a stop-band, each of the other single light emitting photonic crystals has a periodically varying refractive index, and emission of light from the one more other single light emitting photonic crystals is produced when light from the first single light emitting photonic crystal is absorbed by the photoluminescent materials in those other single light emitting photonic crystals energizing them into photoluminescent light emission.

In various embodiments of a light emitting device in accordance with paragraph 87 of this disclosure each of a plurality of single light emitting photonic crystals may further comprise a series of layers of varying refractive index.

In various embodiments of a light emitting device in accordance with paragraph 87 of this disclosure a layer of lower refractive index in the first single light emitting photonic crystal that contains the organic electroluminescent emitter material may also comprise additional organic materials each having a low index of refraction relative to an adjacent layer, wherein organic materials are at least one of a charge carrier transport material, a charge carrier injection material, or a charge carrier injection material.

In various embodiments of a light emitting device in accordance with paragraph 87 of this disclosure a light emitting device may be built up on a substrate. That substrate may be transparent allowing light from the light emitting device to emitted from the bottom of the substrate.

In various embodiments of a light emitting device in accordance with paragraph 87 of this disclosure a light emitting device may be built up on a substrate with a metallic reflector interposed between the light emitting device and the substrate.

In various embodiments of a light emitting device in accordance with paragraph 87 of this disclosure a light emitting device may be built up on a substrate with one or more of the one or more other single light emitting photonic crystals located on the opposite side of the first single light emitting photonic crystal from the substrate.

In various embodiments of a light emitting device in accordance with paragraph 87 of this disclosure a light emitting device may be built up on a substrate with one or more of the one or more other single light emitting photonic crystals located between the first single light emitting photonic crystal and the substrate.

In various embodiments of a light emitting device in accordance with paragraph 87 of this disclosure a light emitting device may comprise an anode with the anode interposed between the zone in which the electroluminescent emitter comprised by the first single light emitting photonic crystal is localized and the substrate.

In various embodiments of a light emitting device in accordance with paragraph 87 of this disclosure a light emitting device may comprise an anode with the zone in which the electroluminescent emitter comprised by the first single light emitting photonic crystal is localized interposed between the anode and the substrate.

In various embodiments of a light emitting device in accordance with paragraph 87 of this disclosure at least one of the one or more other single light emitting photonic crystals the photoluminescent material may be comprised by a single layer comprised by said single light emitting photonic crystal. The photoluminescent material may be present in only a portion of the thickness of that single layer.

In various embodiments of a light emitting device in accordance with paragraph 87 of this disclosure at least one or more of the one or more other single light emitting photonic crystals may contain more than one layer containing photoluminescent material.

In various embodiments of a light emitting device in accordance with paragraph 87 of this disclosure a first single light emitting photonic crystal having an organic electroluminescent emitter material disposed within the first single photonic crystal and one other single light emitting photonic crystal having photoluminescent material disposed within the one other single light emitting photonic crystal may be comprised by the light emitting device. This light emitting device may emit a mixture of blue or violet light and yellow light and this mixture of emitted light may be perceived as white light.

In various embodiments of a light emitting device in accordance with paragraph 87 of this disclosure a first single light emitting photonic crystal having organic electroluminescent emitter material disposed within said first single light emitting photonic crystal and two other single light emitting photonic crystals having a different photoluminescent materials disposed in each of the two other single light emitting photonic crystals may be comprised by the light emitting device. This light emitting device may emit a mixture of blue or violet light, green light and red light, and this mixture of emitted light may be perceived as white light. This mixture of emitted light may have CIE 1931 2° XYZ Color Space chromaticity coordinates that lie in the rectangle defined by x=0.25 to 0.5 and y=0.2 to 0.45 on the CIE 1931 2° XYZ Color Space Chromaticity Diagram.

In various embodiments of a light emitting device in accordance with paragraph 87 of this disclosure a photoluminescent material comprised by at least one of the other single light emitting photonic crystals is an organic photoluminescent material.

In various embodiments of a light emitting device in accordance with paragraph 87 of this disclosure a photoluminescent material comprised by at least one of the other single light emitting photonic crystals is an organometallic photoluminescent material. The organometallic photoluminescent material may be an organoiridium photoluminescent material.

In various embodiments of a light emitting device in accordance with paragraph 87 of this disclosure a layer comprising the electroluminescent material may be located adjacent to a metallic reflector.

In various embodiments of a light emitting device in accordance with paragraph 87 of this disclosure a first single light emitting photonic crystal contained in the organic light emitting device may comprise one or more material layers with optical thicknesses equal to $(2n+1)\lambda/2$ where n may have values between 1 and 3 and $\lambda$ equals the central wavelength of the photonic crystal stop-band. While the presence of these layers does not stop the layer stack from functioning as a single photonic crystal, it does serve to reduce the width of the stop-band of the photonic crystal. Between one and seven of these $(2n+1)\lambda/2$ thickness layers may introduced depending on the stop-band width narrowing required and these total number of layers in the photonic crystal. One of the $(2n+1)\lambda/2$ thickness layers may contain the organic electroluminescent emitter material.

In various embodiments of a light emitting device in accordance with paragraph 87 of this disclosure a first single light emitting photonic crystal contained in the organic light emitting diode device comprises a stack of layers having a periodic modulation of refractive index of period $\lambda/2$, where $\lambda$ equals the central wavelength of the photonic crystal stop-band. This modulation is uniformly periodic, not in terms of the physical thickness of the layers, but in terms of their optical thickness. While the layers comprised by one period of modulation may be two in number and of equal thickness, the layers may be two in number and of unequal optical thickness with the result that the width of the stop-band that is created is reduced. There may also be more than two layers comprised by one period of optical thickness modulation.

In various embodiments of a light emitting device in accordance with paragraph 87 of this disclosure a first single light emitting photonic crystal contained in the organic light emitting diode device may have a periodic modulation of the refractive index of light and the single light emitting photonic crystal may contain sufficient periods of periodic modulation to produce a stop-band with short wavelength and long wavelength band edges that are less than 160 nanometers apart.

In various embodiments of a light emitting device in accordance with paragraph 87 of this disclosure a first single light emitting photonic crystal contained in the organic light emitting diode device may have a periodic modulation of the refractive index of light and the single light emitting photonic crystal may contain sufficient periods of periodic modulation to produce a stop-band with short wavelength and long wavelength band edges that are less than 110 nanometers apart.

In various embodiments of a light emitting device in accordance with paragraph 87 of this disclosure a first single light emitting photonic crystal contained in the organic light emitting diode device may have a periodic modulation of the refractive index of light and the single light emitting photonic crystal may contain sufficient periods of periodic modulation to produce a stop-band with short wavelength and long wavelength band edges that are less than 70 nanometers apart.

In various embodiments of a light emitting device in accordance with this disclosure a single light emitting photonic crystal includes an organic electroluminescent emitter material disposed within the single light emitting photonic crystal, wherein the electroluminescent emitter material is localized in a zone that has an optical thickness of less than 10% of the total optical thickness of the photonic crystal. In these embodiments the organic electroluminescent emitter material has a free space emission spectrum that at least in part overlaps the stop-band of the photonic crystal and the electroluminescent emitter material emits light at a wavelength corresponding to short wavelength edge of the stop-band that the organic electroluminescent emitter material overlaps. In these embodiments the single light emitting photonic crystal is made up of a stack of layers of varying refractive index in which a layer of lower refractive index contains the organic electroluminescent emitter material. Also, in these embodiments the single light emitting photonic crystal may further comprise a second luminescent material.

In various embodiments of a light emitting device in accordance with paragraph 108 of this disclosure a luminescent material may be electroluminescent material.

In various embodiments of a light emitting device in accordance with paragraph 108 of this disclosure a luminescent material may be photoluminescent material.

In various embodiments of a light emitting device in accordance with paragraph 108 of this disclosure a layer of lower refractive index in the single light emitting photonic crystal that contains the organic electroluminescent emitter material may also comprise additional organic materials each having a low index of refraction relative to an adjacent layer, wherein organic materials are at least one of a charge carrier transport material, a charge carrier injection material, or a charge carrier injection material.

In various embodiments of a light emitting device in accordance with paragraph 108 of this disclosure a luminescent material may have a free space emission spectrum that at least in part overlaps the long wavelength edge of the stop-band of the photonic crystal. The photoluminescent material may emit light at a wavelength corresponding to the long wavelength edge of the stop-band.

In various embodiments of a light emitting device in accordance with paragraph 108 of this disclosure a luminescent material may be an organic material.

In various embodiments of a light emitting device in accordance with paragraph 108 of this disclosure a luminescent material may be an organometallic material.

In various embodiments of a light emitting device in accordance with paragraph 108 of this disclosure a luminescent material may be comprised by a single layer of the photonic crystal.

In various embodiments of a light emitting device in accordance with paragraph 108 of this disclosure a luminescent material may be located in more than one layer.

In various embodiments of a light emitting device in accordance with paragraph 108 of this disclosure, band edges of the stop-band may be less than 140 nm. apart in wavelength.

In various embodiments of a light emitting device in accordance with paragraph 108 of this disclosure a light emitting device may emit light in two separate emission bands. The emitted light may be perceived as white light.

In various embodiments of a light emitting device in accordance with paragraph 108 of this disclosure a luminescent material may be electroluminescent material and this electroluminescent material may be located in the same layer as the organic electroluminescent emitter.

In various embodiments of a light emitting device in accordance with paragraph 108 of this disclosure a light emitting device may be built up on top of a substrate.

In various embodiments of a light emitting device in accordance with paragraph 108 of this disclosure a light emitting device may be built up on top of a transparent substrate and the transparent substrate may allow light to be emitted from the bottom surface of the substrate.

In various embodiments of a light emitting device in accordance with paragraph 108 of this disclosure a metallic reflector may be interposed between a substrate and the light emitting device.

In various embodiments of a light emitting device in accordance with paragraph 108 of this disclosure a luminescent material may be comprised by a single layer and the layer comprising the organic electroluminescent material may be interposed between the layer comprising the luminescent material and a metallic reflector.

In various embodiments of a light emitting device in accordance with paragraph 108 of this disclosure a luminescent material may be comprised by a single layer and the layer comprising the luminescent material may be interposed between the layer comprising the organic electroluminescent material and a metallic reflector.

In various embodiments of a light emitting device in accordance with paragraph 108 of this disclosure a light emitting device may comprise an anode and a substrate, and the anode may be interposed between the zone in which the organic electroluminescent material is localized and the substrate.

In various embodiments of a light emitting device in accordance with paragraph 108 of this disclosure a light emitting device may comprise an anode and a substrate, and the zone in which the organic electroluminescent material is localized may be interposed between the anode and the substrate.

In various embodiments of a light emitting device in accordance with paragraph 108 of this disclosure a light emitting device may comprise a metallic reflector and the layer containing the organic electroluminescent material may be located adjacent to the metallic reflector.

In various embodiments of a light emitting device in accordance with paragraph 108 of this disclosure a single light emitting photonic crystal contained in the organic light emitting device may comprise one or more material layers with optical thicknesses equal to $(2n+1)\lambda/2$ where n may have values between 1 and 3 and $\lambda$ equals the central wavelength of the photonic crystal stop-band. While the presence of these layers does not stop the layer stack from functioning as a single photonic crystal, it does serve to reduce the width of the stop-band of the photonic crystal. Between one and seven of these $(2n+1)\lambda/2$ thickness layers may introduced depending on the stop-band width narrowing required and the total number of layers in the photonic crystal. One of the $(2n+1)\lambda/2$ thickness layers may contain the organic electroluminescent emitter material.

In various embodiments of a light emitting device in accordance with paragraph 108 of this disclosure a single light emitting photonic crystal contained in the organic light emitting diode device comprises a stack of layers having a periodic modulation of refractive index of period $\lambda/2$, where $\lambda$ equals the central wavelength of the photonic crystal stop-band. This modulation is uniformly periodic, not in terms of the physical thickness of the layers, but in terms of their optical thickness. While the layers comprised by one period of modulation may be two in number and of equal thickness, the layers may be two in number and of unequal optical thickness with the result that the width of the stop-band that is created is reduced. There may also be more than two layers comprised by one period of optical thickness modulation.

In various embodiments of a light emitting device in accordance with paragraph 108 of this disclosure a single light emitting photonic crystal contained in the organic light emitting diode device may have a periodic modulation of the refractive index of light and the single light emitting photonic crystal may contain sufficient periods of periodic modulation to produce a stop-band with short wavelength and long wavelength band edges that are less than 160 nanometers apart.

In various embodiments of a light emitting device in accordance with paragraph 108 of this disclosure a single light emitting photonic crystal contained in the organic light emitting diode device may have a periodic modulation of the refractive index of light and the single light emitting photonic crystal may contain sufficient periods of periodic modulation to produce a stop-band with short wavelength and long wavelength band edges that are less than 110 nanometers apart.

In various embodiments of a light emitting device in accordance with paragraph 108 of this disclosure a single light emitting photonic crystal contained in the organic light emitting diode device may have a periodic modulation of the refractive index of light and the single light emitting photonic crystal may contain sufficient periods of periodic modulation to produce a stop-band with short wavelength and long wavelength band edges that are less than 70 nanometers apart.

In various embodiments of a light emitting device in accordance with this disclosure a light emitting photonic crystal that comprises an organic electroluminescent emitter material disposed within the single light emitting photonic crystal, wherein the electroluminescent emitter material is localized in a zone that has an optical thickness of less than 10% of the total optical thickness of the photonic crystal. In these embodiments the organic electroluminescent emitter material has a free space emission spectrum that at least in part overlaps the stop-band of the photonic crystal and the electroluminescent emitter material emits light at a wavelength corresponding to the short wavelength edge of the stop-band that the organic electroluminescent emitter material overlaps. In these embodiments the single light emitting photonic crystal is made up of a stack of layers of varying refractive index in which a layer of lower refractive index contains the organic electroluminescent emitter material. In these embodiments the single light emitting photonic crystal may further comprise a second luminescent material. In these embodiments the light emitting device further comprises one or more other single light emitting photonic crystals each having a photoluminescent material disposed within the single photonic crystal wherein in each of the other single light emitting photonic crystals the photoluminescent material has a free space emission spectrum that at least in part overlaps the stop-band of that photonic crystal. In these embodiments each of the other single light emitting photonic crystals emits light at a wavelength corresponding to the edge of a stop-band, each of the other single light emitting photonic crystals has a periodically varying refractive index, and emission of light from the one more other single light emitting photonic crystals is produced when light from the first single light emitting photonic crystal is absorbed by the photoluminescent materials in those other single light emitting photonic crystals energizing them into photoluminescent light emission.

In various embodiments of a light emitting device in accordance with paragraph 133 of this disclosure a luminescent material may be electroluminescent material.

In various embodiments of a light emitting device in accordance with paragraph 133 of this disclosure a luminescent material may be photoluminescent material.

In various embodiments of a light emitting device in accordance with paragraph 133 of this disclosure a layer of lower refractive index in the first single light emitting photonic crystal that contains the organic electroluminescent emitter material may also comprise additional organic materials each having a low index of refraction relative to an adjacent layer, wherein organic materials are at least one of a charge carrier transport material, a charge carrier injection material, or a charge carrier injection material.

In various embodiments of a light emitting device in accordance with paragraph 133 of this disclosure a luminescent material may have a free space emission spectrum that at least in part overlaps the long wavelength edge of the stop-band of the first single light emitting photonic crystal. The photoluminescent material may emit light at a wavelength corresponding to the long wavelength edge of the stop-band.

In various embodiments of a light emitting device in accordance with paragraph 133 of this disclosure a luminescent material may be an organic material.

In various embodiments of a light emitting device in accordance with paragraph 133 of this disclosure a luminescent material may be an organometallic material.

In various embodiments of a light emitting device in accordance with paragraph 133 of this disclosure a luminescent material may be comprised by a single layer of the first single light emitting photonic crystal.

In various embodiments of a light emitting device in accordance with paragraph 133 of this disclosure a luminescent material may be located in more than one layer.

In various embodiments of a light emitting device in accordance with paragraph 133 of this disclosure a band edges of the stop-band may be less than 140 nm. apart in wavelength.

In various embodiments of a light emitting device in accordance with paragraph 133 of this disclosure a light emitting device may emit light in three separate emission bands. The emitted light may be perceived as white light.

In various embodiments of a light emitting device in accordance with paragraph 133 of this disclosure a light emitting device may emit light in four separate emission bands. The emitted light may be perceived as white light.

In various embodiments of a light emitting device in accordance with paragraph 133 of this disclosure a luminescent material may be electroluminescent material and this electroluminescent material may be located in the same layer as the organic electroluminescent emitter.

In various embodiments of a light emitting device in accordance with paragraph 133 of this disclosure a light emitting device may be built up on top of a substrate.

In various embodiments of a light emitting device in accordance with paragraph 133 of this disclosure a light emitting device may be built up on top of a transparent substrate and the transparent substrate may allow light to be emitted from the bottom surface of the substrate.

In various embodiments of a light emitting device in accordance with paragraph 133 of this disclosure a metallic reflector may be interposed between a substrate and the light emitting device.

In various embodiments of a light emitting device in accordance with paragraph 133 of this disclosure a luminescent material may be comprised by a single layer and the layer comprising the organic electroluminescent material may be interposed between the layer comprising the luminescent material and a metallic reflector.

In various embodiments of a light emitting device in accordance with paragraph 133 of this disclosure a luminescent material may be comprised by a single layer and the layer comprising the luminescent material may be interposed between the layer comprising the organic electroluminescent material and a metallic reflector.

In various embodiments of a light emitting device in accordance with paragraph 133 of this disclosure a light emitting device may comprise an anode and a substrate, and the anode may be interposed between the zone in which the organic electroluminescent material is localized and the substrate.

In various embodiments of a light emitting device in accordance with paragraph 133 of this disclosure a light emitting device may comprise an anode and a substrate, and the zone in which the organic electroluminescent material is localized may be interposed between the anode and the substrate.

In various embodiments of a light emitting device in accordance with paragraph 133 of this disclosure a layer of lower refractive index in the single light emitting photonic crystal that contains the organic electroluminescent emitter material may also comprise additional organic materials each having a low index of refraction relative to an adjacent layer, wherein organic materials are at least one of a charge carrier transport material, a charge carrier injection material, or a charge carrier injection material and, in addition, the luminescent material.

In various embodiments of a light emitting device in accordance with paragraph 133 of this disclosure a light emitting device may comprise a metallic reflector and the layer containing the organic electroluminescent material may be located adjacent to the metallic reflector.

In various embodiments of a light emitting device in accordance with paragraph 133 of this disclosure a first single light emitting photonic crystal contained in the organic light emitting device may comprise one or more material layers with optical thicknesses equal to $(2n+1)\lambda/2$ where n may have values between 1 and 3 and $\lambda$ equals the central wavelength of the photonic crystal stop-band. While the presence of these layers does not stop the layer stack from functioning as a single photonic crystal, it does serve to reduce the width of the stop-band of the first single light emitting photonic crystal. Between one and seven of these $(2n+1)\lambda/2$ thickness layers may introduced depending on the stop-band width narrowing required and the total number of layers in the first single light emitting photonic crystal. One of the $(2n+1)\lambda/2$ thickness layers may contain the organic electroluminescent emitter material.

In various embodiments of a light emitting device in accordance with paragraph 133 of this disclosure a first single light emitting photonic crystal contained in the organic light emitting diode device comprises a stack of layers having a periodic modulation of refractive index of period $\lambda/2$, where $\lambda$ equals the central wavelength of the photonic crystal stop-band. This modulation is uniformly periodic, not in terms of the physical thickness of the layers, but in terms of their optical thickness. While the layers comprised by one period of modulation may be two in number and of equal thickness, the layers may be two in number and of unequal optical thickness with the result that the width of the stop-band that is created is reduced. There may also be more than two layers comprised by one period of optical thickness modulation.

In various embodiments of a light emitting device in accordance with paragraph 133 of this disclosure a first single light emitting photonic crystal contained in the organic light emitting diode device may have a periodic modulation of the refractive index of light and the first single light emitting photonic crystal may contain sufficient periods of periodic modulation to produce a stop-band with short wavelength and long wavelength band edges that are less than 160 nanometers apart.

In various embodiments of a light emitting device in accordance with paragraph 133 of this disclosure a first single light emitting photonic crystal contained in the organic light emitting diode device may have a periodic modulation of the refractive index of light and the first single light emitting photonic crystal may contain sufficient periods of periodic modulation to produce a stop-band with short wavelength and long wavelength band edges that are less than 110 nanometers apart.

In various embodiments of a light emitting device in accordance with paragraph 133 of this disclosure a first single light emitting photonic crystal contained in the organic light emitting diode device may have a periodic modulation of the refractive index of light and the first single light emitting photonic crystal may contain sufficient periods of periodic modulation to produce a stop-band with short wavelength and long wavelength band edges that are less than 70 nanometers apart.

In various embodiments of a light emitting device in accordance with paragraph 133 of this disclosure each of the other single light emitting photonic crystals may further comprise a series of layers of varying refractive index.

In various embodiments of a light emitting device in accordance with paragraph 133 of this disclosure a layer of lower refractive index in the first single light emitting photonic crystal that contains the organic electroluminescent emitter material may also comprise additional organic materials each having a low index of refraction relative to an adjacent layer, wherein organic materials are at least one of a charge carrier transport material, a charge carrier injection material, or a charge carrier injection material.

In various embodiments of a light emitting device in accordance with paragraph 133 of this disclosure a light emitting device may be built up on a substrate. That substrate may be transparent allowing light from the light emitting device to emitted from the bottom of the substrate.

In various embodiments of a light emitting device in accordance with paragraph 133 of this disclosure a light emitting device may be built up on a substrate with a metallic reflector interposed between the light emitting device and the substrate.

In various embodiments of a light emitting device in accordance with paragraph 133 of this disclosure a light emitting device may be built up on a substrate with one or more of the one or more other single light emitting photonic crystals located on the opposite side of the first single light emitting photonic crystal from the substrate.

In various embodiments of a light emitting device in accordance with paragraph 133 of this disclosure a light emitting device may be built up on a substrate with one or more of the one or more other single light emitting photonic crystals located between the first single light emitting photonic crystal and the substrate.

In various embodiments of a light emitting device in accordance with paragraph 133 of this disclosure a light emitting device may comprise an anode with the anode interposed between the zone in which the electroluminescent emitter comprised by the first single light emitting photonic crystal is localized and the substrate.

In various embodiments of a light emitting device in accordance with paragraph 133 of this disclosure a light emitting device may comprise an anode with the zone in which the electroluminescent emitter comprised by the first single light emitting photonic crystal is localized interposed between the anode and the substrate.

In various embodiments of a light emitting device in accordance with paragraph 133 of this disclosure a at least one of the one or more other single light emitting photonic crystals the photoluminescent material may be comprised by a single layer comprised by that single light emitting photonic crystal. The photoluminescent material may be present in only a portion of the thickness of that single layer.

In various embodiments of a light emitting device in accordance with paragraph 133 of this disclosure a least one or more of the one or more other single light emitting photonic crystals may contain more than one layer containing photoluminescent material.

In various embodiments of a light emitting device in accordance with paragraph 133 of this disclosure a first single light emitting photonic crystal having an organic electroluminescent emitter material disposed within the first single photonic crystal and one other single light emitting photonic crystal having photoluminescent material disposed within the one other single light emitting photonic crystal may be comprised by the light emitting device. This light emitting device may emit a mixture of blue or violet light and yellow light and this mixture of emitted light may be perceived as white light.

In various embodiments of a light emitting device in accordance with paragraph 133 of this disclosure a first single light emitting photonic crystal having organic electroluminescent emitter material disposed within said first single light emitting photonic crystal and two other single light emitting photonic crystals having a different photoluminescent materials disposed in each of the two other single light emitting photonic crystals may be comprised by the light emitting device. This light emitting device may emit a mixture of blue or violet light, green light and red light, and this mixture of emitted light may be perceived as white light. This mixture of emitted light may have CIE 1931 2° XYZ Color Space chromaticity coordinates that lie in the rectangle defined by x=0.25 to 0.5 and y=0.2 to 0.45 on the CIE 1931 2° XYZ Color Space Chromaticity Diagram.

In various embodiments of a light emitting device in accordance with paragraph 133 of this disclosure a photoluminescent material comprised by at least one of the other single light emitting photonic crystals is an organic photoluminescent material.

In various embodiments of a light emitting device in accordance with paragraph 133 of this disclosure a photoluminescent material comprised by at least one of the other single light emitting photonic crystals is an organometallic photoluminescent material. The organometallic photoluminescent material may be an organoiridium photoluminescent material.

In the various embodiments described above references to organic materials may be taken to include organometallic materials.

In the various embodiments described above references to organic materials may be taken to include combinations of organic materials that may produce exciplex light emission when energized.

We claim:

1. A single light emitting photonic crystal having an organic electroluminescent emitter material disposed within the single light emitting photonic crystal:
   wherein the organic electroluminescent emitter material comprises an organic light emitting material localized in a zone having less than 10% of an optical thickness of the single light emitting photonic crystal, and has a free space emission spectrum that at least in part overlaps a stop-band of the single light emitting photonic crystal,
   wherein the single light emitting photonic crystal emits light at a wavelength corresponding to an edge of the stop-band that the organic electroluminescent emitter materials overlaps, and further comprises a stack of layers of varying refractive index,
   wherein a layer of lower index of refraction materials comprises the organic electroluminescent emitter material, and
   wherein the stack of layers has a periodic modulation, measured in optical thickness, of refractive index with a period of modulation of $\lambda/2$ wherein $\lambda$ equals a central wavelength of the single light emitting photonic crystal stop-band.

2. The single light emitting photonic crystal of claim 1, wherein the stack of layers of varying refractive index comprised by the single light emitting photonic crystal comprises at least one pair of layers of materials with different refractive indices that, in turn, comprises a first layer of material with a higher refractive index and a second layer of a material with a lower refractive index,
   wherein the total optical thicknesses of the two layers combined equals $\lambda/2$, and
   wherein $\lambda$ equals a central wavelength of the single light emitting photonic crystal stop-band.

3. The single light emitting photonic crystal of claim 2 wherein the first layer of material and the second layer of material do not have the same optical thickness.

4. The single light emitting photonic crystal of claim 1 wherein the period of the refractive index modulation through the stack of layers is disrupted from between one to seven times by insertion of a layer of constant refractive index having an optical thickness equal to $(2n+1)\lambda/4$ wherein n is an integer between 1 and 3 and wherein $\lambda$ is the central wavelength of the stop-band of the single light emitting photonic crystal.

5. The single light emitting photonic crystal of claim 4 wherein the period of the refractive index modulation through the stack of layers is disrupted one time by a layer having a thickness of $3\lambda/4$ and wherein said layer that disrupts the refractive index modulation of the layer stack comprises the organic electroluminescent emitter material.

6. The single light emitting photonic crystal of claim 1, wherein the edge of the stop-band occurs at a wavelength at which measured radiance of free space luminescent light emission by the organic electroluminescent emitter material is greater than one-quarter of the peak radiance of the free space luminescent emission spectrum of the emitter material.

7. The light emitting device of claim 1, further comprising:
   one or more additional light emitting photonic crystals, each having photoluminescent material disposed within the single light emitting photonic crystal,
   wherein in each of the other single light emitting photonic crystals the photoluminescent material has a free space emission spectrum that at least in part overlaps the stop-band of that light emitting photonic crystal,
   wherein each of the additional single light emitting photonic crystals emits light at a wavelength corresponding to an edge of a stop-band,
   wherein each of the additional single light emitting photonic crystals has a periodically varying refractive index, and
   wherein emission of light from the one more other single light emitting photonic crystals is produced when light from the first single light emitting photonic crystal is absorbed by the photoluminescent material in those other single light emitting photonic crystals energizing them into photoluminescent light emission.

8. The single photonic crystal of claim 1, wherein the single light emitting photonic crystal emits light at a wavelength corresponding to the short wavelength edge of the stop-band,
wherein a second organic electroluminescent emitter material is disposed within the single light emitting photonic crystal,
wherein the second organic electroluminescent emitter material has a free space emission spectrum that at least in part overlaps a stop-band of the single light emitting photonic crystal,
wherein the single light emitting photonic crystal also emits light at a wavelength corresponding to the long wavelength edge of the stop-band that the second organic electroluminescent emitter material overlaps.

9. The single light emitting photonic crystal of claim 1, wherein the layer comprising the electroluminescent material and additional organic materials, each having a low index of refraction respective to an adjacent layer, is located adjacent to a metallic reflector.

10. A single light emitting photonic crystal having an organic electroluminescent emitter material disposed within the single light emitting photonic crystal, comprising a stack of layers having a periodic modulation, measured in optical thickness, of refractive index with a period of modulation of $\lambda/2$, wherein $\lambda$ equals a central wavelength of the single light emitting photonic crystal stop-band, and an emitter configured to emit light into one or more stop-bands thereby causing the single light emitting photonic crystal to emit light associated with two separate and distinct stop-band edges.

11. A single light emitting photonic crystal having an organic electroluminescent emitter material disposed within the single light emitting photonic crystal, comprising a stack of layers having a periodic modulation, measured in optical thickness, of refractive index with a period of modulation of $\lambda/2$, wherein 2 equals a central wavelength of the single light emitting photonic crystal stop-band, wherein the period of the refractive index modulation through the stack of layers is disrupted from between one to seven times by insertion of a layer of constant refractive index having an optical thickness equal to $(2n+1)\lambda/4$ wherein n is an integer between 1 and 3 and wherein $\lambda$ is the central wavelength of the stop-band of the single light emitting photonic crystal.

* * * * *